United States Patent
Chang et al.

(10) Patent No.: US 9,536,794 B2
(45) Date of Patent: Jan. 3, 2017

(54) TECHNIQUES FOR DUAL DIELECTRIC THICKNESS FOR A NANOWIRE CMOS TECHNOLOGY USING OXYGEN GROWTH

(71) Applicant: International Business Machines Corporation, Armonk, NY (US)

(72) Inventors: Josephine B. Chang, Mahopac, NY (US); Michael A. Guillorn, Yorktown Heights, NY (US); Isaac Lauer, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/671,041

(22) Filed: Mar. 27, 2015

(65) Prior Publication Data

US 2016/0284604 A1    Sep. 29, 2016

(51) Int. Cl.
| | |
|---|---|
| *H01L 27/12* | (2006.01) |
| *H01L 21/84* | (2006.01) |
| *H01L 21/8238* | (2006.01) |
| *H01L 27/092* | (2006.01) |
| *H01L 29/423* | (2006.01) |

(52) U.S. Cl.
CPC ....... *H01L 21/84* (2013.01); *H01L 21/823807* (2013.01); *H01L 27/092* (2013.01); *H01L 27/1203* (2013.01); *H01L 29/42392* (2013.01)

(58) Field of Classification Search
CPC ............. H01L 21/84; H01L 21/823807; H01L 27/092; H01L 27/1203; H01L 29/42392
USPC ........................................................ 257/351
See application file for complete search history.

(56) References Cited

U.S. PATENT DOCUMENTS

| | | |
|---|---|---|
| 7,879,669 B1 | 2/2011 | Teng et al. |
| 7,884,004 B2 | 2/2011 | Bangsaruntip et al. |
| 8,422,273 B2 | 4/2013 | Chang et al. |
| 8,536,563 B2 | 9/2013 | Bangsaruntip et al. |
| 8,557,613 B2 | 10/2013 | Shearn et al. |
| 8,659,006 B1 | 2/2014 | Chang et al. |
| 8,927,397 B2 | 1/2015 | Chang et al. |
| 2009/0289306 A1 | 11/2009 | Watanabe et al. |

(Continued)

OTHER PUBLICATIONS

Cartier et al., "pFET Vt control with HfO2/TiN/poly-Si gate stack using a lateral oxygenation process," 2009 Symposium on VLSI Technology, pp. 42-43 (Jun. 2009).

(Continued)

*Primary Examiner* — Matthew Gordon
(74) *Attorney, Agent, or Firm* — Louis J. Percello; Michael J. Chang, LLC

(57) ABSTRACT

In one aspect, a method of forming a CMOS device includes forming nanowires suspended over a BOX, wherein a first/second one or more of the nanowires are suspended at a first/second suspension height over the BOX, and wherein the first suspension height is greater than the second suspension height; depositing a conformal gate dielectric on the BOX and around the nanowires wherein the conformal gate dielectric deposited on the BOX is i) in a non-contact position with the conformal gate dielectric deposited around the first one or more of the nanowires, and ii) is in direct physical contact with the conformal gate dielectric deposited around the second one or more of the nanowires such that the BOX serves as an oxygen source during growth of a conformal oxide layer at the interface between the conformal gate dielectric and the second one or more of the nanowires.

20 Claims, 12 Drawing Sheets

(56) References Cited

U.S. PATENT DOCUMENTS

2014/0048773 A1    2/2014  Chang et al.
2014/0051213 A1    2/2014  Chang et al.
2014/0097502 A1    4/2014  Sun et al.

OTHER PUBLICATIONS

Kuo et al., "Impacts of Gap Thickness Scaling on Thin-Film Transistors with Suspended Nanowire Channels," IEEE 2011 International Symposium on VLSI Technology, Systems and Applications (VLSI-TSA), pp. 1-2 (Apr. 2011).

TECHNIQUES FOR DUAL DIELECTRIC THICKNESS FOR A NANOWIRE CMOS TECHNOLOGY USING OXYGEN GROWTH

FIELD OF THE INVENTION

The present invention relates to nanowire complementary metal oxide semiconductor (CMOS) devices and more particularly, to techniques for creating dual dielectric thickness for nanowire CMOS technology using oxygen growth based on varying a suspension height of the nanowires over a buried oxide (BOX).

BACKGROUND OF THE INVENTION

Threshold voltage (Vt) is an important parameter to be able to control in metal oxide semiconductor field effect transistor (MOSFET) devices. In bulk MOSFET designs wherein the channel is formed in a bulk semiconductor, the Vt is commonly adjusted through doping. It is often desirable to have multiple Vt's in a MOSFET design wherein the Vt varies from one device to another.

Setting multiple Vt's in a fully depleted technology presents many challenges, as doping to adjust Vt is no longer an option. It has been found that the Vt of planar p-channel FETs can be adjusted through oxidation of the high-κ gate dielectric. See for example, Cartier et al., "pFET Vt control with HfO2/TiN/poly-Si gate stack using a lateral oxygenation process," 2009 Symposium on VLSI Technology, pgs. 42-43 (June 2009) (hereinafter "Cartier") and U.S. Patent Application Publication Number 2009/0289306 A1 by Watanabe et al., entitled "Lateral Oxidation with High-k Dielectric Liner" (hereinafter "U.S. Patent Application Publication Number 2009/0289306 A1").

There however exists a need for controlling Vt in non-planar device configurations.

SUMMARY OF THE INVENTION

The present invention provides techniques for creating dual dielectric thickness for nanowire complementary metal oxide semiconductor (CMOS) technology using oxygen growth based on varying a suspension height of the nanowires over a buried oxide (BOX). In one aspect of the invention, a method of forming a CMOS device is provided. The method includes the steps of: providing a semiconductor-on-insulator (SOI) wafer having a SOI layer separated from a substrate by a BOX; forming nanowires suspended over the BOX, wherein a first one or more of the nanowires are suspended at a first suspension height over the BOX and a second one or more of the nanowires are suspended at a second suspension height over the BOX, and wherein the first suspension height is greater than the second suspension height; depositing a conformal gate dielectric on the BOX and around the nanowires, wherein the conformal gate dielectric deposited on the BOX is i) in a non-contact position with the conformal gate dielectric deposited around the first one or more of the nanowires, and ii) is in direct physical contact with the conformal gate dielectric deposited around the second one or more of the nanowires; depositing a conformal gate metal layer on the conformal gate dielectric both on the wafer and on the nanowires, wherein the conformal gate metal layer fully surrounds the first one or more of the nanowires but only partially surrounds the second one or more of the nanowires due to the conformal gate dielectric on the BOX being in direct physical contact with the conformal gate dielectric around the second one or more of the nanowires; depositing a conformal polysilicon layer on the conformal gate metal layer both on the wafer and on the nanowires; and annealing the CMOS device in an oxygen ambient to grow a conformal oxide layer at an interface between the conformal gate dielectric and the nanowires, wherein the conformal oxide layer grown at the interface between the conformal gate dielectric and the first one or more of the nanowires has a first thickness and the conformal oxide layer grown at the interface between the conformal gate dielectric and the second one or more of the nanowires has a second thickness, and wherein the first thickness is less than the second thickness due to the BOX serving as an oxygen source during growth of the conformal oxide layer at the interface between the conformal gate dielectric and the second one or more of the nanowires.

In another aspect of the invention, a CMOS device is provided. The CMOS device includes nanowires suspended over a BOX, wherein a first one or more of the nanowires are suspended at a first suspension height over the BOX and a second one or more of the nanowires are suspended at a second suspension height over the BOX, and wherein the first suspension height is greater than the second suspension height; a conformal gate dielectric on the BOX and around the nanowires, wherein the conformal gate dielectric on the BOX is i) in a non-contact position with the conformal gate dielectric around the first one or more of the nanowires, and ii) is in direct physical contact with the conformal gate dielectric around the second one or more of the nanowires; a conformal gate metal layer on the conformal gate dielectric both on the wafer and on the nanowires, wherein the conformal gate metal layer fully surrounds the first one or more of the nanowires but only partially surrounds the second one or more of the nanowires due to the conformal gate dielectric on the BOX being in direct physical contact with the conformal gate dielectric around the second one or more of the nanowires; a conformal polysilicon layer on the conformal gate metal layer both on the wafer and on the nanowires; and a conformal oxide layer at an interface between the conformal gate dielectric and the nanowires, wherein the conformal oxide layer at the interface between the conformal gate dielectric and the first one or more of the nanowires has a first thickness and the conformal oxide layer at the interface between the conformal gate dielectric and the second one or more of the nanowires has a second thickness, and wherein the first thickness is less than the second thickness.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for controlling the threshold voltage (Vt) of nanowire complementary metal oxide semiconductor (CMOS) devices using a gate first process wherein a suspension height of the nanowires over the buried oxide (BOX) is modulated to control whether or not the high-κ gate dielectric in the present polysilicon/metal/high-κ gate stacks contacts the BOX. The term "high-κ" refers to a material having a dielectric constant κ which is higher than that of silicon (i.e., 11.7). When there is contact between the high-κ gate dielectric and the BOX, a greater amount of oxide growth occurs at the interface between the gate dielectric and the nanowires. Namely, the BOX in that case acts as an additional source of oxygen which diffuses through the high-κ gate dielectric. Oxidation reduces the Vt. See for example, Cartier and U.S. Patent Application Publication Number 2009/0289306 A1, the contents of each of which are incorporated by reference as if fully set forth herein. Being able to regulate the amount of oxidation permits one to thereby regulate the amount by which the Vt is lowered. For instance, when the high-κ gate dielectric and the BOX are not in contact (such as when the metal gate stack layers are present therebetween—see below) then the amount of growth at the gate dielectric-nanowire interface is minimal.

A first exemplary embodiment of the present techniques is now described by way of reference to FIGS. 1-12 which illustrate an exemplary process for forming a nanowire CMOS device. In this example, a variation in the suspension height of the nanowires over the underlying BOX is achieved using a stepped surface of a sacrificial material on an insulator wafer to produce nanowires at varying heights above the wafer. Gate stacks will then be formed as a series of conformal layers around the nanowires. The suspension height of the nanowires controls the space under the nanowires for deposition of the gate stack materials and ultimately whether or not the high-κ gate dielectric in the gate stack is in contact with the insulator.

Figure 1:
FIG. 1 is a cross-sectional diagram illustrating a starting structure for forming a nanowire complementary metal oxide semiconductor (CMOS) device including a semiconductor-on-insulator (SOI) wafer having a SOI layer separated from a substrate by a buried oxide (BOX) according to an embodiment of the present invention.

As shown in FIG. 1, the process begins with a semiconductor-on-insulator (SOI) wafer. Specifically, the SOI wafer includes a SOI layer 106 separated from a substrate 102 by a BOX 104 (e.g., silicon dioxide ($SiO_2$)). In the present example, the SOI layer 106 will be used to provide a stepped surface onto which the nanowires can be formed. The SOI layer 106 will subsequently be removed to suspend the nanowires. Thus, the SOI layer 106 in this case is a sacrificial layer. Accordingly, the SOI layer is preferably formed from a material that can be easily removed selective to the nanowires. By way of example only, if the nanowires are silicon (Si) (see below), then a suitable sacrificial material for forming SOI layer 106 includes, but is not limited to, silicon germanium (SiGe). In that case, the starting wafer is a SiGe-on-insulator wafer.

Next, a series of masking and etching steps are used to create a stepped surface on a side of the SOI layer 106 opposite the BOX 104. See FIGS. 2 and 3. It is notable that the thickness of the SOI layer 106 will control the suspension height of the nanowires (i.e., the height at which the nanowires are suspended over the BOX). The stepped surface varies the thickness of the SOI layer in different regions of the wafer. Thus, the starting thickness of the SOI layer 106 should be at least as thick as the greatest suspension height desired. For illustrative purposes only, the various regions of the wafer in which different nanowire suspension heights will be created are labeled as region I, region II, etc.

Figure 2:
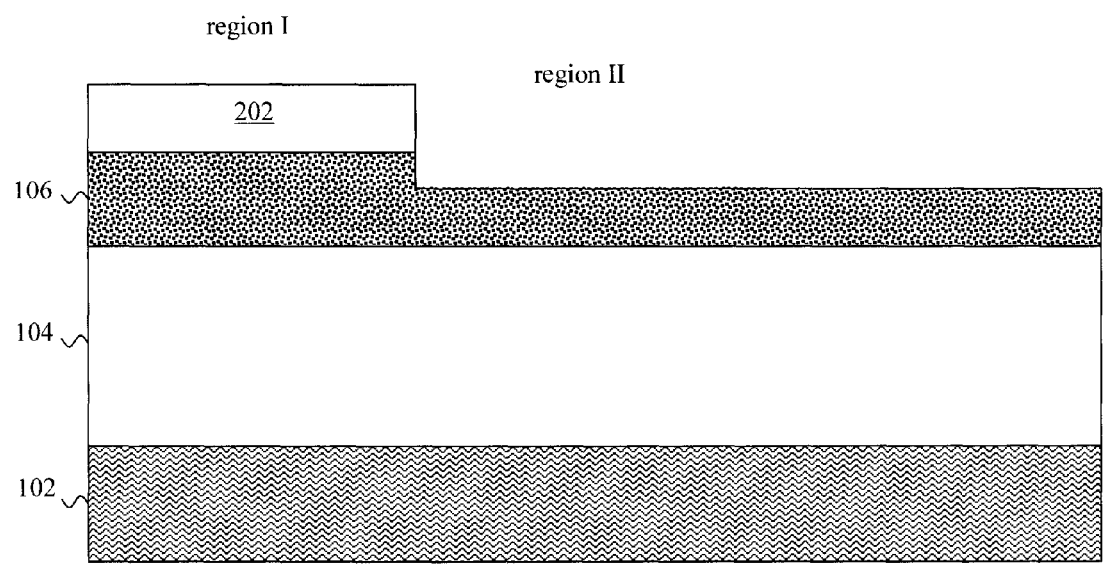
FIG. 2 is a cross-sectional diagram illustrating a stepped surface of the SOI layer having been formed in a first and a second regions of the wafer according to an embodiment of the present invention.

According to an exemplary embodiment, the stepped surface of the SOI layer 106 is created by masking the SOI layer in a first region(s) of the wafer (labeled "region I") and using an etching process to reduce the thickness of the SOI layer 106 in one or more other regions of the wafer. See FIG. 2. As shown in FIG. 2, a mask 202 is formed on the SOI layer 106 in the first region(s) (region I) of the wafer. Mask 202 may be formed using a standard lithography and etching process. A timed etch (using for example reactive ion etching (RIE)) is then used to remove unmasked portions of the SOI layer 106. The etch is endpointed when the (unmasked) portions of the SOI layer 106 reach a desired (reduced) thickness. As highlighted above, the goal of this step etch is to control the suspension height of the nanowires, and ultimately to regulate whether or not the gate stack materials fully surround the nanowires. Thus, the desired thickness of the SOI layer 106 is directly related to the desired nanowire suspension height.

Figure 3:
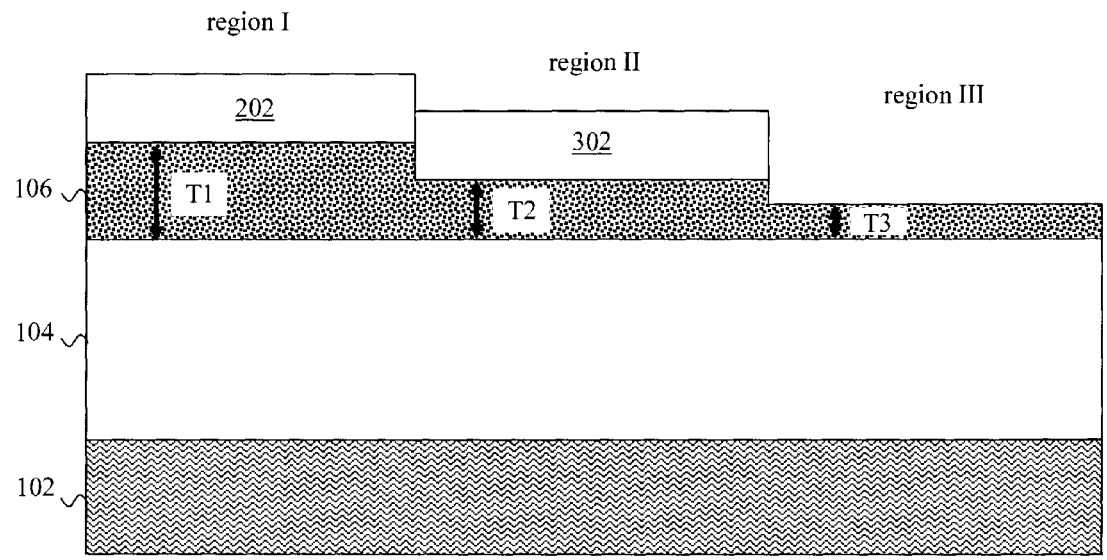
FIG. 3 is a cross-sectional diagram illustrating a stepped surface of the SOI layer having been formed in a third region of the wafer according to an embodiment of the present invention.

At this point in the process, the SOI layer 106 (via the stepped surface) now has regions with two different thicknesses. One could now move on to form the nanowires over this stepped surface. However, in order to further illustrate the present process for forming a stepped surface, a region of the SOI layer having a third thickness is created. See FIG. 3. Specifically, as shown in FIG. 3 a mask 302 is formed on the SOI layer 106 in a second region(s) (region II) of the wafer. Again, mask 302 may be formed using a standard lithography and etching process. Mask 202 (covering/masking the first region(s) (region I) of the wafer can remain in place. A timed etch (using for example RIE) is then used to remove unmasked portions of the SOI layer 106. The etch is endpointed when the (unmasked) portions of the SOI layer 106 (that are in this case in a third region(s) (region III) of the wafer) reach a desired (reduced) thickness. Following completion of the stepped surface etch, any remaining hardmask may then be removed.

As shown in FIG. 3, the result of the step surface etch is the SOI layer having different thicknesses in different regions of the wafer. In this particular example, the SOI layer 106 has three different thicknesses T1, T2, and T3 in regions I, II, and III of the wafer, respectively. As provided above, the thickness of the SOI layer 106 controls the suspension height of the nanowires, i.e., the height at which the nanowires will be suspended over the BOX after the SOI layer 106 is removed. Thus, in this particular example, nanowires will be produced that are suspended over the BOX at three different heights (H1, H2, and H3—see below).

The terms "first," "second," "third," etc. may be used throughout the present description to distinguish the nanowires, the various different suspension heights, BOX undercut depths (see below), layer thicknesses, etc. For instance, according to the present techniques, one or more first nanowires will be formed at a first suspension height over the BOX, one or more second nanowires will be formed at a second suspension height H2 over the BOX, etc., wherein H1 is greater than H2 (i.e., H1>H2), etc. The various first, second, etc. suspension heights may be achieved, for example, using the stepped SOI having a first thickness, a second thickness, etc., or by undercutting the BOX (see below) to a first depth, a second depth, etc. As noted above, it is not required that the same number of suspension heights, thicknesses, depths, etc. be created as shown (for example, embodiments are anticipated herein where only two different suspension heights are employed rather than, e.g., the three shown.

To begin the nanowire formation phase of the process, a layer 402 of a semiconductor material is epitaxially grown on the SOI layer 106. See FIG. 4. As provided above, since the SOI layer 106 will serve as a sacrificial release layer that is removed in order to suspend the nanowires, the materials for forming the SOI layer 106 and the nanowires should be chosen to enable removal of the SOI layer selective to the nanowires. By way of example only, a SiGe SOI layer 106 and Si nanowires is a suitable combination. Thus, according to an exemplary embodiment, epitaxial Si is grown as layer 402 on the stepped surface of the SOI layer 106.

Figure 4:
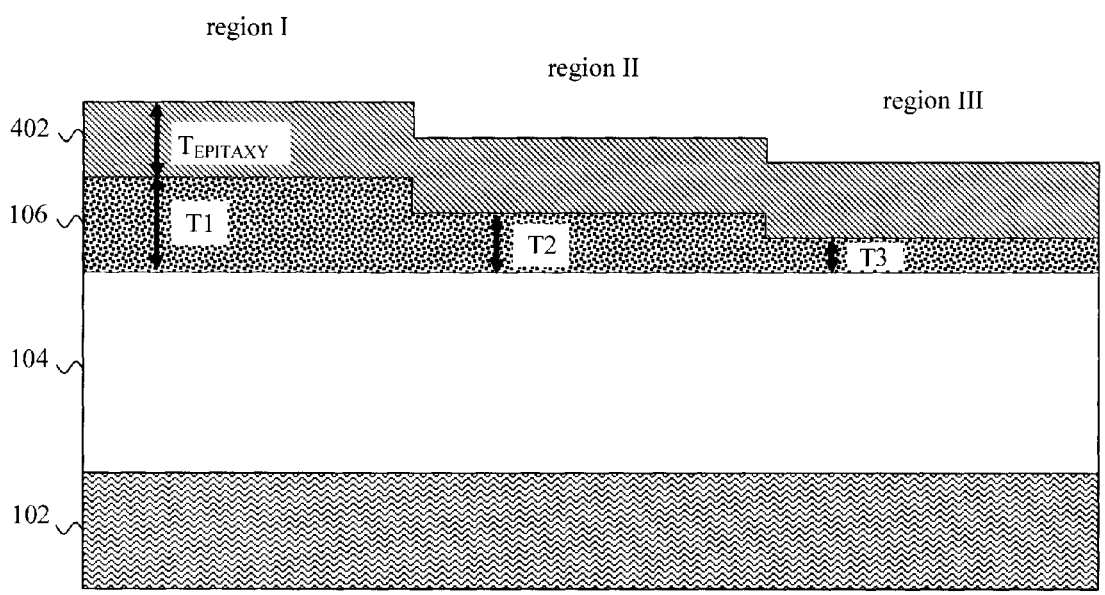
FIG. 4 is a cross-sectional diagram illustrating a layer of a semiconductor material having been epitaxially grown on the SOI layer according to an embodiment of the present invention.

As shown in FIG. 4, the epitaxial layer 402 of semiconductor material is preferably grown to a uniform thickness $T_{EPITAXY}$ on SOI layer 106. This will result in nanowires being produced having the same cross-sectional shape and dimensions. However, due to the SOI layer 106 having a stepped surface, the nanowires will be present at various different heights above the BOX. According to an exemplary embodiment, the epitaxial layer 402 is grown to a uniform thickness $T_{EPITAXY}$ of from about 5 nanometers (nm) to about 20 nm, and ranges therebetween, on the SOI layer 106.

Fins are then patterned in the epitaxial layer 402/SOI layer 106. See FIG. 5. Standard lithography and etching techniques may be used to form the fins. By way of example only, a hardmask 502 can be formed on a side of the epitaxial layer 402 opposite the SOI layer 106 with the footprint and location of the fins. With nanowire device configurations wherein the nanowires are suspended it is oftentimes preferable to employ pads to anchor the ends of the nanowires. By way of example only, the pads can be attached at opposite ends of the nanowires forming a ladder-like configuration wherein the nanowires are arranged like the rungs of a ladder. See, for example, U.S. Pat. No. 8,927,397 issued to Chang et al., entitled "Diode Structure and Method for Gate All Around Silicon Nanowire Technologies" (hereinafter "U.S. Pat. No. 8,927,397"), the contents of which are incorporated by reference as if fully set forth herein. In that case, the hardmask 502 will have a corresponding ladder like shape. See, for example, FIG. 2 of U.S. Pat. No. 8,927,397.

Figure 5:
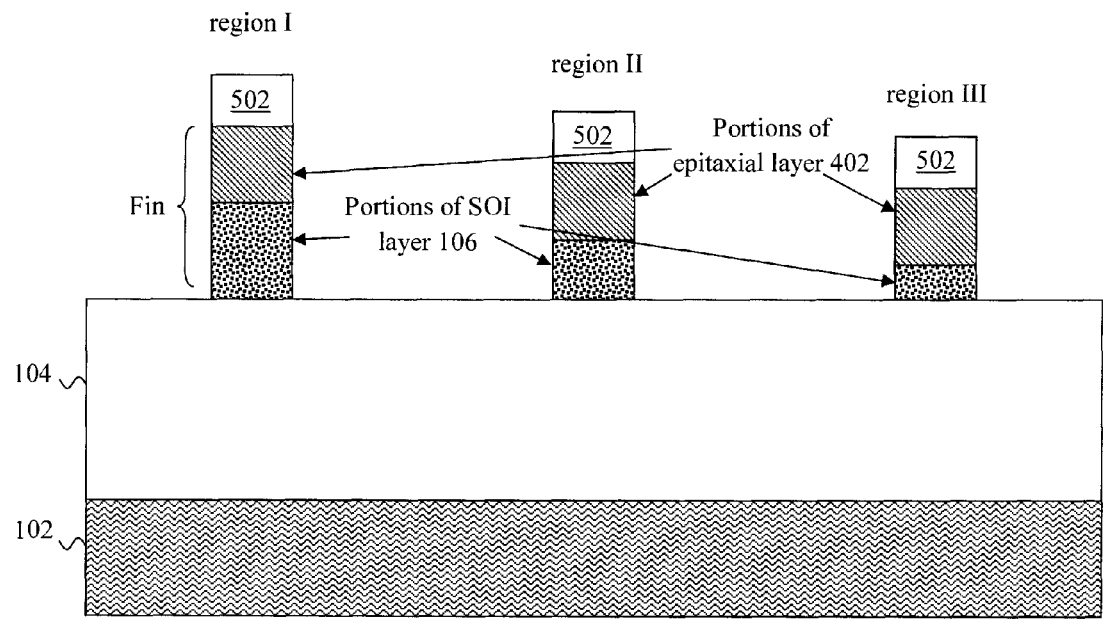
FIG. 5 is a cross-sectional diagram illustrating fins having been patterned in the epitaxial layer/SOI layer according to an embodiment of the present invention.

Using hardmask 502 as a mask, an etch (such as RIE) can then be used to pattern the fins in the epitaxial layer 402/SOI layer 106. The BOX can serve as an etch stop for the fin RIE. Following the fin etch, the hardmask 502 can be removed. As shown in FIG. 5, each of the fins contains a portion of the epitaxial layer 402 and a portion of the SOI layer 106. These portions of the epitaxial layer 402 will form the nanowires of the device.

Next, the SOI layer 106 is removed from the fins selective to the epitaxial layer 402 which releases the epitaxial layer 402 from the fins. See FIG. 6. The released epitaxial layer 402 forms the suspended nanowires 602 of the device. According to an exemplary embodiment, the SOI layer 106 is formed from SiGe and the epitaxial layer 402 is formed from Si, and the SOI layer 106 is removed from the fins using a chemical etchant that exploits the lower oxidation potential of the SiGe SOI layer 106 as compared to the Si epitaxial layer 402. Examples of such an etchant include, but are not limited to, a 1:2:3 mixture of HF:hydrogen peroxide ($H_2O_2$):acetic acid ($CH_3COOH$), or a mixture of sulfuric acid ($H_2SO_4$) and $H_2O_2$. Alternatively, SOI layer 106 can be selectively removed using a dry etching process such as oxygen ($O_2$) plasma etching or plasma chemistries typically used for etching. As will be described below, when nanowire anchor pads are present, a portion of the SOI layer 106 will remain beneath the pads.

Figure 6:
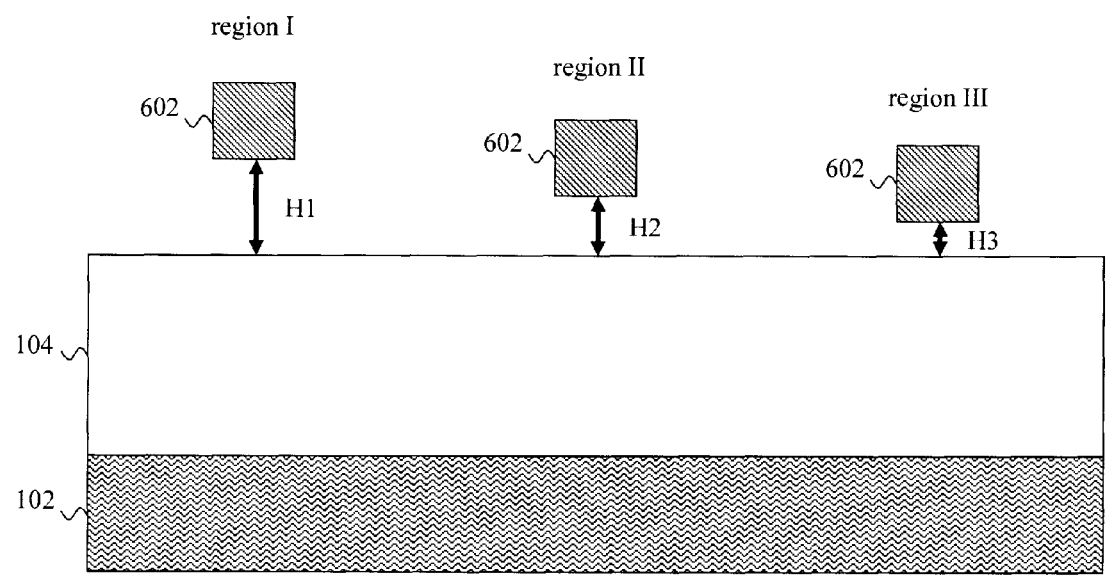
FIG. 6 is a cross-sectional diagram illustrating the SOI layer having been removed from the fins selective to the epitaxial layer which releases the epitaxial layer from the fins, wherein the released epitaxial layer forms suspended nanowires of the device according to an embodiment of the present invention.

As shown in FIG. 6, based on the (now-suspended) nanowires 602 having been formed on a stepped surface of the SOI layer 106, the nanowires 602 are suspended at varying heights above the BOX 104. For instance, in this particular example, the nanowires are suspended over the BOX at three different heights H1, H2, and H3 in regions I, II, and III of the wafer, respectively. It is notable that the designation of a particular region of the wafer having nanowires at a particular suspension height (e.g., region I of the wafer having nanowires at the highest suspension height H1) is arbitrary and the highest, lowest, etc. suspension heights of the nanowires may instead occur in other regions of the wafer. It is also notable that for ease and clarity of depiction a single nanowire is being shown at each height H1, H2, and H3. This is merely an example, and embodiments are anticipated herein where multiple nanowires are present at a given height. See, for example, FIGS. 24 and 25, described below.

According to an exemplary embodiment, once suspended by removal of the SOI layer 106, the nanowires 602 are then re-shaped, e.g., smoothed to give them an elliptical and in some cases a circular cross-sectional shape. See FIG. 7. The smoothing of the nanowires may be performed, for example, by annealing the nanowires in a hydrogen-containing atmosphere. Exemplary annealing temperatures are from about 600 degrees Celsius (° C.) to about 1,000° C., and a hydrogen pressure of from about 600 torr to about 700 torr may be employed. Exemplary techniques for re-shaping nanowires may be found, for example, in U.S. Pat. No. 7,884,004 issued to Bangsaruntip et al., entitled "Maskless Process for Suspending and Thinning Nanowires," the contents of which are incorporated by reference as if fully set forth herein. During this smoothing process, the nanowires are also thinned. According to one exemplary embodiment, the nanowires at this stage have a circular cross-sectional shape with a cross-sectional diameter of from about 7 nm to about 35 nm. If so desired, it is also possible to further thin the nanowires using, e.g., a high-temperature oxidation process. The process for thinning nanowires using high-temperature oxidation is described, for example, in U.S. Pat. No. 8,927,397.

Figure 7:
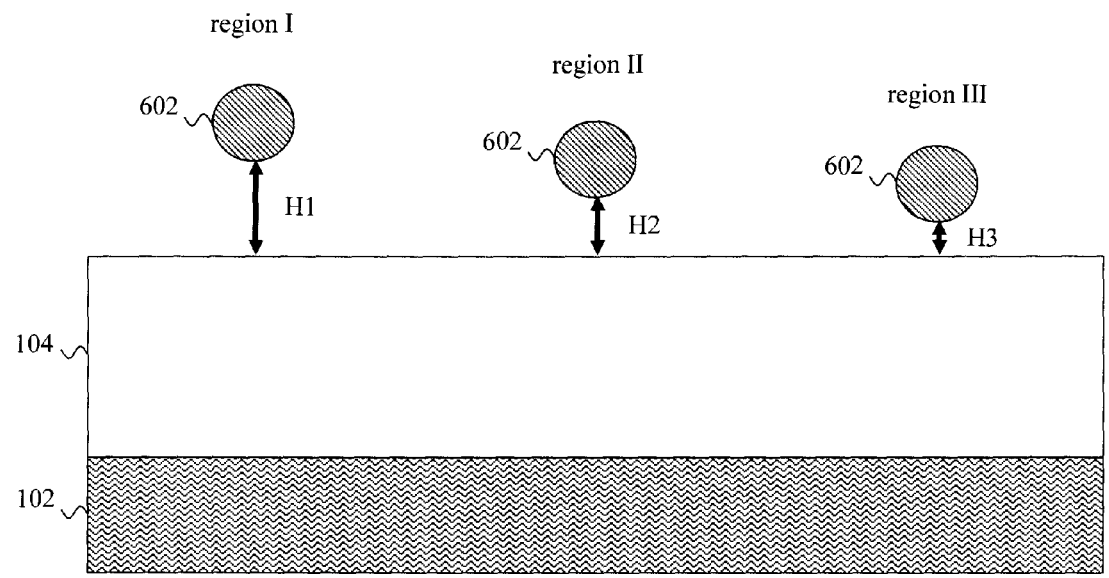
FIG. 7 is a cross-sectional diagram illustrating the nanowires having been re-shaped, e.g., smoothed, to give them a circular cross-sectional shape according to an embodiment of the present invention.
Figure 8:
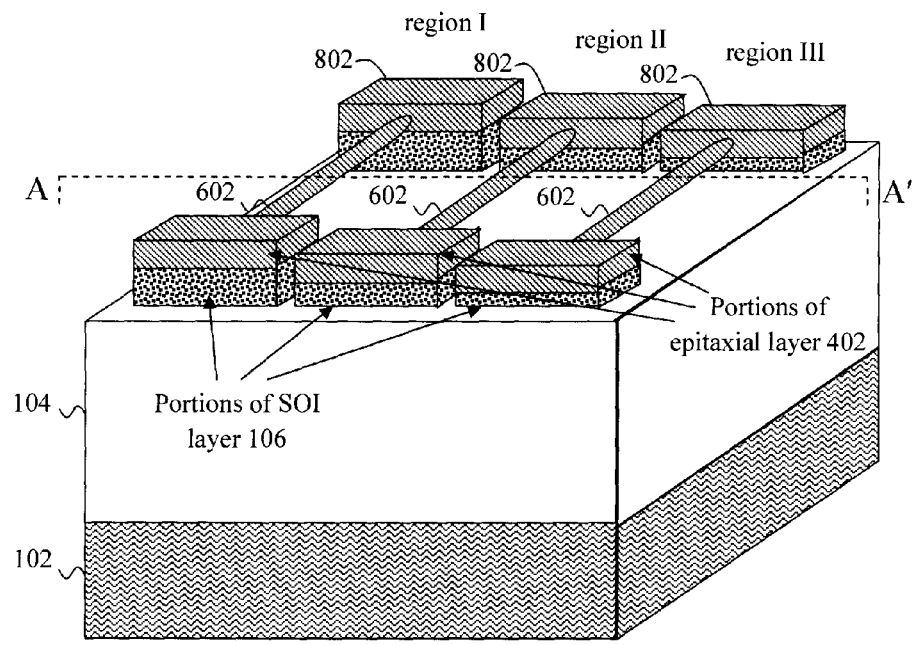
FIG. 8 is a three-dimensional diagram illustrating an exemplary embodiment wherein both nanowires and pads have been patterned in the epitaxial layer according to an embodiment of the present invention.

As provided above, pads are typically employed to anchor the ends of the nanowires especially when the nanowires are to be suspended. FIG. 8 provides an example of what a three-dimensional representation of the nanowires 602 and pads 802 might look like according to an exemplary embodiment wherein both nanowires and pads are patterned in the epitaxial layer 402. By way of example only, FIG. 7 depicts a cross-sectional cut through line A-A' (see FIG. 8), and the other cross-sectional views of this exemplary embodiment are similarly oriented in the figures.

In the example shown in FIG. 8, three sets of nanowires 602 and pads 802 are formed, one in each of region I, region II, and region III of the wafer. As provided above, based on the stepped surface of the SOI layer 106, the nanowires 602 will be suspended at different heights above the BOX 104 in each of these regions. As also provided above, the depiction of a single nanowire in each region is merely exemplary, and embodiments are anticipated herein where multiple suspended nanowires are present in each of one or more of the regions.

In order to anchor the suspended nanowires 602 to the wafer, the pads 802 must themselves be attached to the wafer. Thus, as shown in FIG. 8, a portion of the SOI layer 106 remains present beneath each of the pads 802. It is notable that using the above-described etching processes to release the nanowires 602 will also lead to some lateral etching of the SOI layer 106 beneath the pads. However, due to the relatively larger mass of the SOI layer under the pads 802 as compared to under the nanowires 602, a portion of the SOI layer 106 will remain present beneath the pads 802 after the nanowire 602 have been fully released.

The present nanowire CMOS devices include one or more nanowire transistors. Each nanowire transistor includes a source and a drain interconnected by one or more of the nanowires, and a gate stack at least partially surrounding a portion of each of the nanowires. The portions of the nanowires surrounded by the gate stacks serve as (nanowire) channels of the devices. The portions of the nanowires extending laterally out from the gate stack and the pads serve as source and drain regions of the devices. The process for forming the gate stacks is now described. The term "gate stack" as used herein refers to the sequence of gate materials deposited one on top of the other, i.e., in a stack. In the present example, one or more of the gate stack materials will be deposited conformally around at least a portion of each of the nanowires. The amount by which one or more of the gate stack materials surrounds the nanowires is directly related to the suspension height of the nanowires. Namely, the greater the suspension height, the more space there is beneath the nanowires for the gate stack materials. The amount (i.e., thickness) of each of the gate stack materials also factors into the spacing beneath the nanowires.

Figure 9:
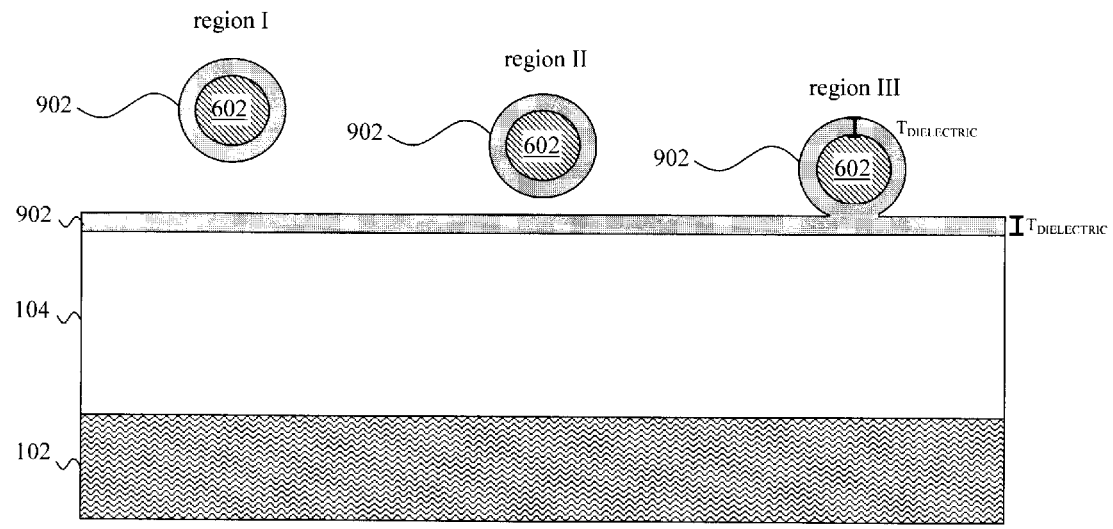
FIG. 9 is a cross-sectional diagram illustrating a conformal gate dielectric having been blanket deposited on the wafer and surrounding the nanowires, wherein a suspension height of the nanowires determines whether the conformal gate dielectric (of a given thickness) does or does not physically contact the underlying BOX according to an embodiment of the present invention.

Switching back now to a cross-sectional view, as shown in FIG. 9 the gate stack formation process begins with the blanket deposition of a conformal gate dielectric 902 on the wafer and surrounding the nanowires 602. Specifically, using a conformal deposition process, such as atomic layer deposition (ALD) or chemical vapor deposition (CVD), the conformal gate dielectric 902 is deposited to a uniform thickness $T_{DIELECTRIC}$ on the exposed surface of the wafer (e.g., on a side of the BOX 104 opposite the substrate 102) and around the nanowires 602. According to an exemplary embodiment, the conformal gate dielectric 902 is a high-κ dielectric material, such as hafnium oxide ($HfO_2$) or lanthanum oxide ($LaO_2$). Further, according to an exemplary embodiment, the same gate dielectric material is deposited around each of the nanowires 602. In that case, a single deposition step may be employed to deposit the conformal gate dielectric 902 on the BOX 104 and around the nanowires 602. However, if so desired, it is possible to vary the composition of the conformal gate dielectric 902 from one nanowire or set of nanowires to another.

As shown in FIG. 9, based on the nanowires 602 having different suspension heights over the BOX 104, the space beneath the nanowires can accommodate different amounts of gate stack material. For instance, in the first and second regions of the wafer (i.e., region I and region II of the wafer in FIG. 9), the nanowires 602 are suspended high enough above the surface of the BOX 104 such that when the layer of the conformal gate dielectric 902 is deposited onto the surface of the BOX 104 and around the nanowires 602 to the thickness $T_{DIELECTRIC}$ there is still space available beneath the nanowires for gate stack materials. Another way to look at it is that following deposition of the conformal gate dielectric 902 to the thickness $T_{DIELECTRIC}$, the conformal gate dielectric 902 deposited onto the surface of the BOX 104 does not make contact (i.e., is in a non-contact position) with the conformal gate dielectric 902 deposited around the nanowires 602 in region I and region II of the wafer. Namely, space is present between the conformal gate dielectric 902 deposited onto the surface of the BOX 104 and the conformal gate dielectric 902 deposited around the nanowires 602 in region I and region II of the wafer.

By contrast, as shown in FIG. 9 following deposition of the conformal gate dielectric 902 to the thickness $T_{DIELECTRIC}$, the conformal gate dielectric 902 deposited onto the surface of the BOX 104 makes contact with the conformal gate dielectric 902 deposited around the nanowire(s) 602 in region III of the wafer. According to the present techniques, oxide growth will be used to modulate the Vt of the transistors in the present nanowire CMOS device. Specifically, when there is direct contact between the (e.g., high-K) gate dielectric 902 and the BOX 104, such as in region III of the present example, a greater amount of oxide growth will occur at the interface between the conformal gate dielectric 902 and the nanowire(s) 602. The BOX acts as an additional source of oxygen which diffuses through the high-κ gate dielectric. By contrast, in regions I and II of the present example, additional gate stack materials will be deposited between the conformal gate dielectric 902 on the BOX 104 and the conformal gate dielectric around the nanowires 602. This is due to the nanowires 602 being more highly suspended in region I and region II of the wafer thus providing more space beneath the nanowires 602 to be filled in with gate stack materials. These gate stack materials deposited under the nanowires 602 in region I and region II of the wafer will separate the conformal gate dielectric 902 (surrounding the nanowires 602) from the BOX 104. In that case, the BOX 104 will not serve as an additional source of oxygen during growth, and the oxide grown around the nanowires 602 in region I and region II of the wafer will be less than that in region III of the wafer (where the BOX acts an additional source of oxygen). Namely, oxygen source species ($O_2$, O+, or $H_2O$) diffuse much faster and readily in dielectrics such as silicon dioxide ($SiO_2$) and $HfO_2$ than in the other gate stack materials (such as the gate metal, polysilicon, etc.). Thus, when all that separates the nanowires from the BOX is a dielectric such as $HfO_2$, then the BOX can serve as an oxygen source where oxygen species from the BOX can diffuse through the dielectric to the nanowires. Conversely, when gate metal, polysilicon, etc. are present between the nanowires and the BOX through which oxygen species cannot readily diffuse, then the additional oxygen source is not available.

From the above description it is apparent that the suspension height of the nanowires 602 is a factor in whether or not the conformal gate dielectric 902 contacts the BOX 104. Another important factor is the thickness of the conformal gate dielectric 902 $T_{DIELECTRIC}$. For instance, a thicker $T_{DIELECTRIC}$ increases the height by which the nanowires 602 have to be suspended over the BOX 104 to prevent contact between the conformal gate dielectric 902 and the BOX 104, and vice versa. Given the present description, it would be within the capabilities of one skilled in the art to adjust the nanowire suspension height for a given desired (uniform) dielectric thickness to achieve either contact or non-contact between the conformal gate dielectric 902 and the BOX 104. According to an exemplary embodiment, the conformal gate dielectric 902 is deposited to a uniform thickness $T_{DIELECTRIC}$ of from about 1 nm to about 5 nm, and ranges therebetween, on the BOX 104 and surrounding the nanowires 602.

Next, a conformal gate metal layer 1002 is blanket deposited on the conformal gate dielectric 902 both on the wafer and around the nanowires 602. See FIG. 10. Specifically, using a conformal deposition process, such as ALD or CVD, the conformal gate metal layer 1002 is deposited to a uniform thickness $T_{METAL}$ on the wafer (i.e., on a side of the conformal gate dielectric 902 opposite the BOX 104) and around the nanowires 602 (i.e., on a side of the conformal gate dielectric 902 opposite the nanowires 602). According to an exemplary embodiment, the conformal gate metal layer 1002 includes titanium and/or tantalum, e.g., titanium nitride and/or tantalum nitride. Further, according to an exemplary embodiment, the same gate metal is deposited around each of the nanowires 602. In that case, a single deposition step may be employed to deposit the conformal gate metal layer 1002 on the conformal gate dielectric 902 over the BOX and around the nanowires. However, if so desired, it is possible to vary the composition of the conformal gate metal layer 1002 from one nanowire or set of nanowires to another.

Figure 10:
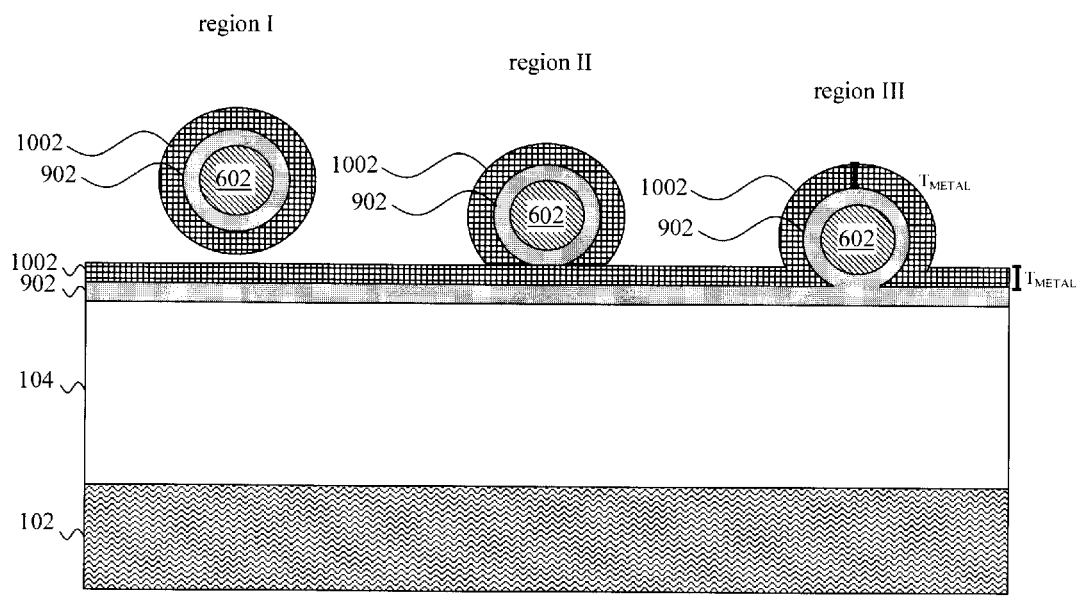
FIG. 10 is a cross-sectional diagram illustrating a conformal gate metal layer having been blanket deposited on the conformal gate dielectric both on the wafer and around the nanowires according to an embodiment of the present invention.

As shown in FIG. 10, based on the nanowires 602 having different suspension heights over the BOX 104, in the first and second regions of the wafer (i.e., region I and region II of the wafer) the conformal gate metal layer 1002 (of thickness $T_{METAL}$) fully surrounds the nanowires 602 and thereby physically separates the conformal gate dielectric 902 surrounding the nanowires 602 from the underlying BOX 104. Thus in region I and region II of the wafer the conformal gate dielectric 902 is not in contact with (i.e., is in a non-contact position with) the BOX 104. By contrast, in region III of the wafer the conformal gate dielectric 902 surrounding the nanowire(s) 602 is in contact with the conformal gate dielectric 902 on the BOX 104. Thus, in region III of the wafer there is direct physical contact between the conformal gate dielectric 902 and the BOX 104. The space beneath the nanowire(s) in this third region (region III) of the wafer is closed off by the conformal gate dielectric 902 over the BOX and around the nanowires and thus does not permit the placement of any additional gate stack materials beneath the nanowire(s) in this region. Accordingly, the conformal gate metal layer 1002 in the region III of the wafer does not completely surround the nanowire(s) (i.e., the conformal gate metal layer 1002 in the region III of the wafer only partially surrounds the nanowire(s)). According to an exemplary embodiment, conformal gate metal layer 1002 is deposited to a uniform thickness $T_{METAL}$ of from about 5 nm to about 20 nm, and ranges therebetween, on the conformal gate dielectric 902 over the BOX and around the nanowires.

A conformal polysilicon layer 1102 is then blanket deposited on the conformal gate metal layer 1002 both on the wafer and around the nanowires 602. See FIG. 11. Specifically, using a conformal deposition process, such as ALD or CVD, the conformal polysilicon layer 1102 is deposited to a uniform thickness $T_{POLY-Si}$ on the wafer (i.e., on a side of the conformal gate metal layer 1002 opposite the conformal gate dielectric 902) and around the nanowires 602 (i.e., on a side of the conformal gate metal layer 1002 opposite the conformal gate dielectric 902).

Figure 11:
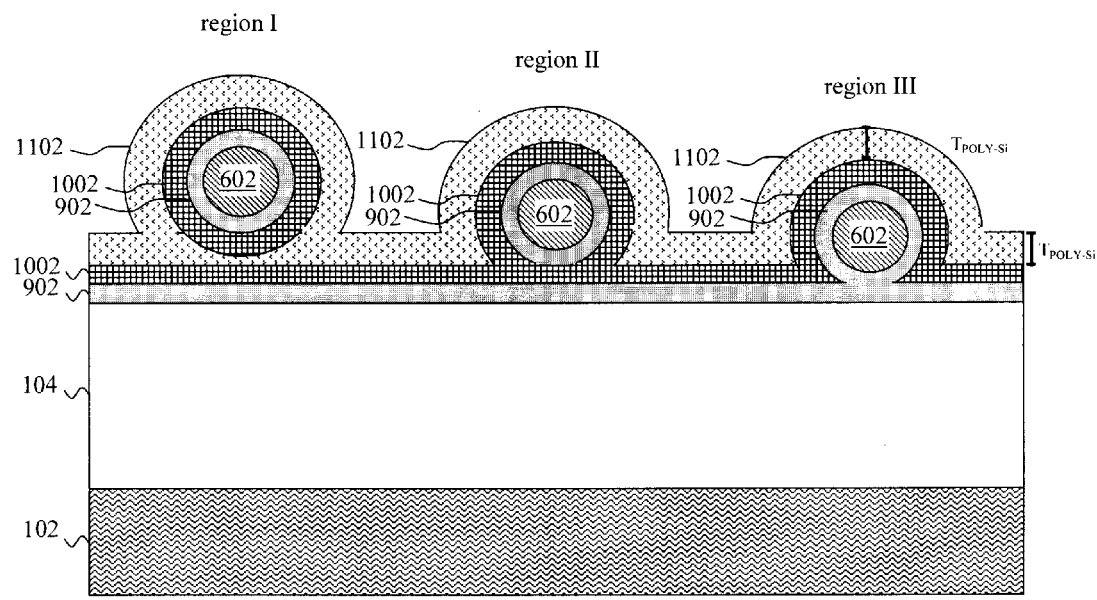
FIG. 11 is a cross-sectional diagram illustrating a conformal polysilicon layer having been blanket deposited on the conformal gate metal layer both on the wafer and around the nanowires according to an embodiment of the present invention.

As shown in FIG. 11, based on the nanowires 602 having different suspension heights over the BOX 104, in the first region of the wafer (i.e., region I of the wafer) the conformal polysilicon layer 1102 (of thickness $T_{POLY-Si}$) fully surrounds the nanowire(s) 602 and (along with the conformal gate metal layer 1002) thereby physically separates the conformal gate dielectric 902 surrounding the nanowire(s) 602 from the underlying BOX 104. In region II of the wafer, the conformal gate metal layer 1002 alone physically separates the conformal gate dielectric 902 surrounding the nanowire(s) 602 from the underlying BOX 104—i.e., the conformal polysilicon layer 1102 in the region II of the wafer only partially surrounds the nanowire(s). Thus in region I and region II of the wafer the conformal gate dielectric 902 is not in contact with the BOX 104. By contrast, as provided above, in region III of the wafer there is direct physical contact between the conformal gate dielectric 902 and the BOX 104. According to an exemplary embodiment, conformal polysilicon layer 1102 is deposited to a uniform thickness $T_{POLY-Si}$ of from about 10 nm to about 30 nm, and ranges therebetween, on the conformal gate metal layer 1002 over the BOX and around the nanowires.

Figure 12:
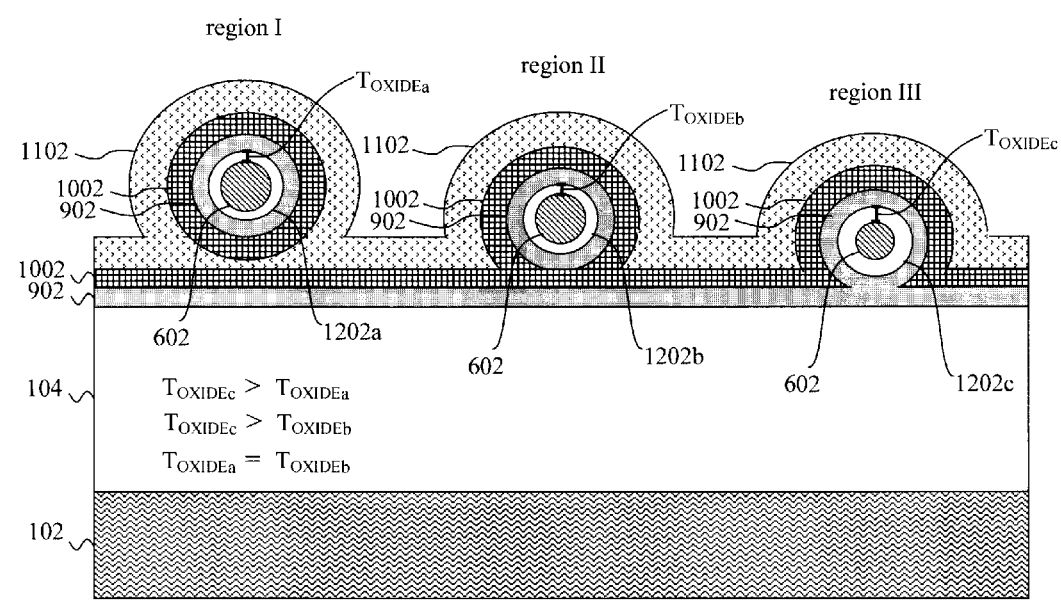
FIG. 12 is a cross-sectional diagram illustrating an anneal in an oxygen ambient having been used to form a conformal oxide layer at the interface between the conformal gate dielectric and the nanowires wherein the conformal gate dielectric, when in direct physical contact with the BOX, permits the BOX to act as an additional oxygen source according to an embodiment of the present invention.

As shown in FIG. 12, an anneal in an oxygen ambient is then used to form a conformal oxide layer 1202 at the interface between the conformal gate dielectric 902 and the nanowires 602. Oxidation occurs at the interface between the conformal gate dielectric and the nanowires due to the relative oxygen affinity of the gate dielectric (e.g., $HfO_2$) versus the semiconductor material in the nanowires (Si, for example, steals oxygen from $HfO_2$ and makes it slightly sub stoichiometric) and metal catalyzation of the oxide growth. Thus, the conformal oxide layer formed is an oxide of the semiconductor material in the nanowires, e.g., $SiO_2$ for Si wires, germanium dioxide ($GeO_2$) or silicon germanium oxide for germanium (Ge) or silicon germanium (SiGe) nanowires, respectively—see below. According to an exemplary embodiment, the anneal is performed at a temperature of from about 200° C. to about 500° C., and ranges therebetween, for a duration of from about 5 minutes to about 15 minutes, and ranges therebetween. In the case where the conformal gate dielectric 902 is in direct physical contact with the BOX 104 (in region III of the wafer in this example), the BOX acts as an additional source of oxygen (i.e., in addition to that provided in the oxygen ambient) which diffuses through the conformal gate dielectric 902— resulting in a greater amount of oxide growth at the interface between the conformal gate dielectric 902 and the nanowires 602. By comparison, in the case where the conformal gate dielectric 902 is not in direct physical contact with the BOX 104 (in region I and region II of the wafer in this example), there is no source of oxygen other than what is provided in the ambient—resulting in a lesser amount of oxide growth at the interface between the conformal gate dielectric 902 and the nanowires 602. As provided above, the amount of oxide growth at the interface between the conformal gate dielectric 902 and the nanowires 602 affects the Vt of the respective transistor, i.e., the greater the amount of oxide the lower the Vt.

The conformal oxide layer formed at the interface between the conformal gate dielectric 902 and the nanowires 602 in each of region I, region II, and region III of the wafer is given the reference numeral 1202a, 1202b, and 1202c, respectively. The amount of oxide growth is quantified herein based on a thickness of the conformal oxide layer $T_{OXIDE}$. The thickness of the conformal oxide layers 1202a, 1202b, and 1202c, are labeled in FIG. 12 as $T_{OXIDEa}$, $T_{OXIDEb}$, and $T_{OXIDEc}$, respectively. As shown in FIG. 12, the thickness of the conformal oxide layer 1202c formed at the interface between the conformal gate dielectric 902 and the nanowires 602 in region III of the wafer ($T_{OXIDEc}$) is greater than the thickness of either the thickness of the conformal oxide layer 1202a formed at the interface between the conformal gate dielectric 902 and the nanowires 602 in region I of the wafer ($T_{OXIDEa}$) or the thickness of the conformal oxide layer 1202b formed at the interface between the conformal gate dielectric 902 and the nanowires 602 in region II of the wafer ($T_{OXIDEb}$). Since, there is no direct physical contact between the conformal gate dielectric 902 and the BOX 104 in region I and region II of the wafer, $T_{OXIDEa}$ and $T_{OXIDEb}$ are likely equivalent (i.e., $T_{OXIDEa}=T_{OXIDEb}$). See FIG. 12. According to an exemplary embodiment, $T_{OXIDEa}$ and $T_{OXIDEb}$ are each from about 0.1 nm to about 1 nm, and ranges therebetween; and $T_{OXIDEc}$ is from about 0.5 nm to about 2 nm, and ranges therebetween.

As is apparent from the above description, an important factor herein is being able to control the suspension height of the nanowires, to thereby control whether or not the gate dielectric contacts the underlying BOX. The process detailed above for forming nanowires on a sacrificial (e.g., SiGe) layer having a stepped surface is merely one possible way anticipated herein for varying nanowire suspension height. Other techniques are possible in accordance with the present teachings. For example, another exemplary embodiment is now described by way of reference to FIGS. 13-23 wherein the BOX is undercut beneath the nanowires, and wherein the suspension height of the nanowires is controlled by regulating the depth of the BOX undercut.

Figure 13:
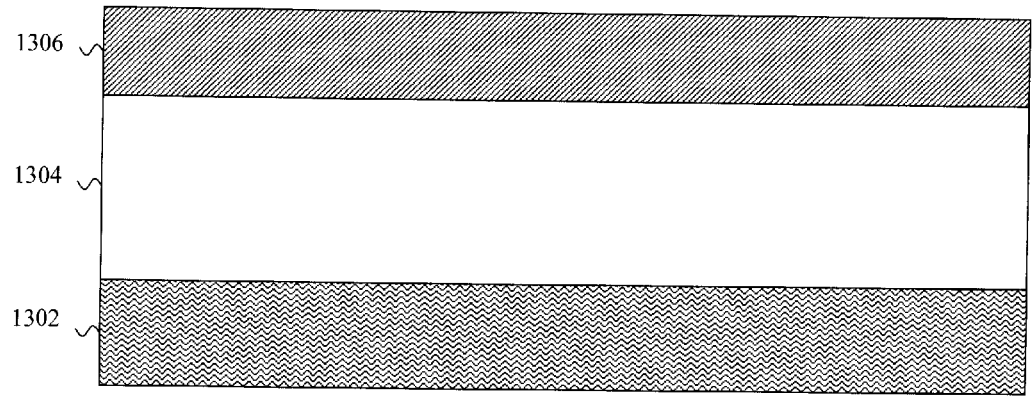
FIG. 13 is a cross-sectional diagram illustrating an alternative starting structure for forming a nanowire CMOS device including a SOI wafer having a SOI layer (in which nanowires and pads will be formed) separated from a substrate by a BOX according to an embodiment of the present invention.

As shown in FIG. 13, the starting structure is an SOI wafer having a SOI layer 1306 separated from a substrate 1302 by a BOX 1304. In this example, the nanowires (and preferably also pads) are formed in the SOI layer 1306. By comparison, in the example above, the SOI layer was used as a sacrificial release layer on which the nanowires (and pads) were formed. Thus, the SOI layer 1306 is formed from a semiconductor material suitable for use in the nanowires (and pads). By way of example only, suitable semiconductor materials for SOI layer 1306 include, but are not limited to, Si, germanium (Ge), and SiGe. In one exemplary embodiment, the SOI layer 1306 is formed from Si.

Figure 14:
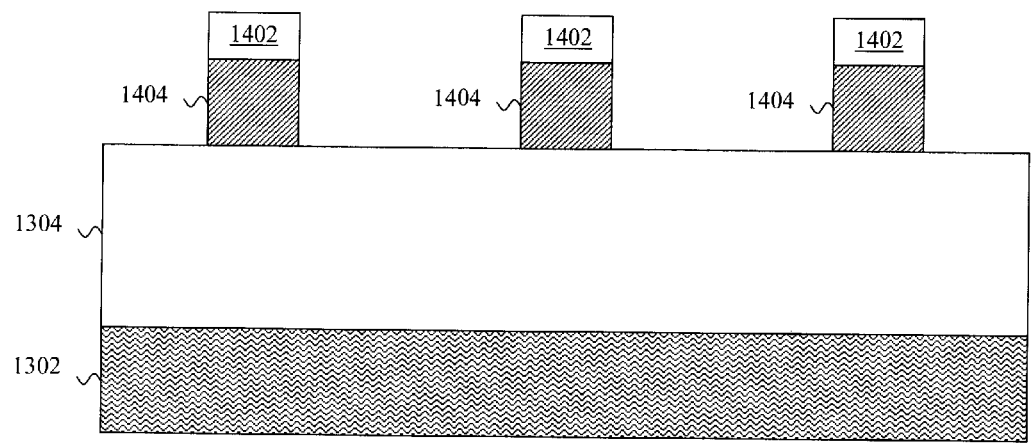
FIG. 14 is a cross-sectional diagram illustrating nanowires having been patterned in the SOI layer according to an embodiment of the present invention.
Figure 15:
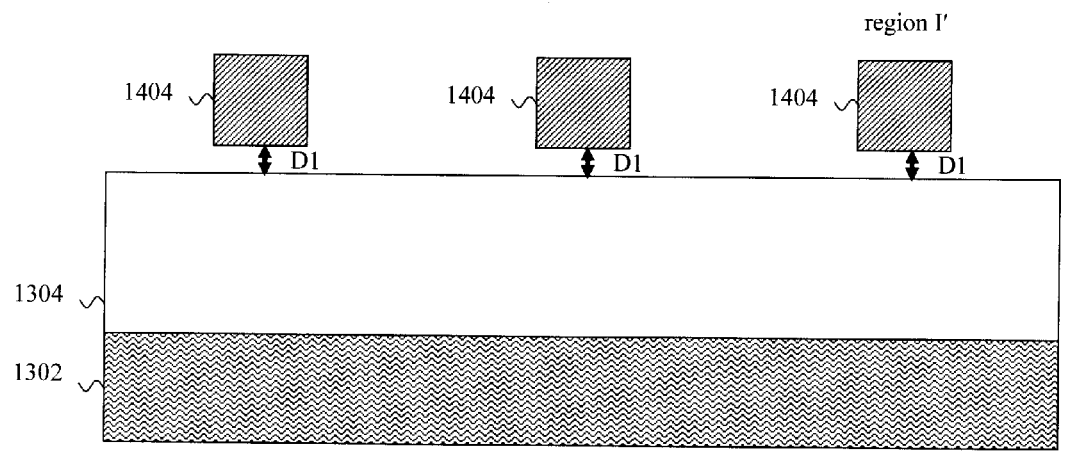
FIG. 15 is a cross-sectional diagram illustrating the nanowires having been suspended over the BOX using an etch to undercut the BOX to a first depth beneath the nanowires in a first region of the wafer according to an embodiment of the present invention.

Next, as shown in FIG. 14, standard lithography and etching techniques are used to pattern nanowires 1404 and pads (not shown) in the SOI layer 1306. By way of example only, a hardmask 1402 can be formed on a side of the SOI layer 1306 opposite the BOX 1304 with the footprint and location of the nanowires 1404 (and pads). As provided above, the nanowires and pads preferably have a ladder-like configuration wherein the nanowires are arranged like the rungs of a ladder. See, for example, U.S. Pat. No. 8,927,397. In that case, the hardmask 502 will have a corresponding ladder like shape. Using hardmask 1402 as a mask, an etch (such as RIE) can then be used to pattern nanowires 1404 (and pads) in the SOI layer 1304. Following the nanowire etch, the hardmask 1402 can be removed.

The nanowires 1404 are then suspended over the BOX 1304 using an etch to remove (i.e., undercut) portions of the BOX 1304 beneath the nanowires 1404. In the present example, the amount by which the BOX 1304 is undercut beneath the nanowires 1404 will be varied to thereby vary the suspension height of the nanowires 1404 over the BOX 1304. Namely, in the first of a series of etching steps, the BOX 1304 is undercut to the same first depth D1 beneath each of the nanowires 1404. See FIG. 15. This etch releases the nanowires from the BOX 1304. According to an exemplary embodiment, this undercut etch of the BOX 1304 is carried out using an isotropic etching process such as diluted hydrofluoric acid (DHF). At room temperature, a 100:1 DHF etches from about 2 nm to about 3 nm of the BOX 1304 per minute. Thus, the timing of the etch can be controlled to control by how much the BOX 1304 is recessed (undercut) beneath the nanowires 1404. In the same manner as described above, the suspension height of the nanowires 1404 (based here on the depth of the undercut) will be used to control (for a given gate dielectric thickness) whether or not the gate dielectric is in direct physical contact with the BOX 1304.

Figure 16:
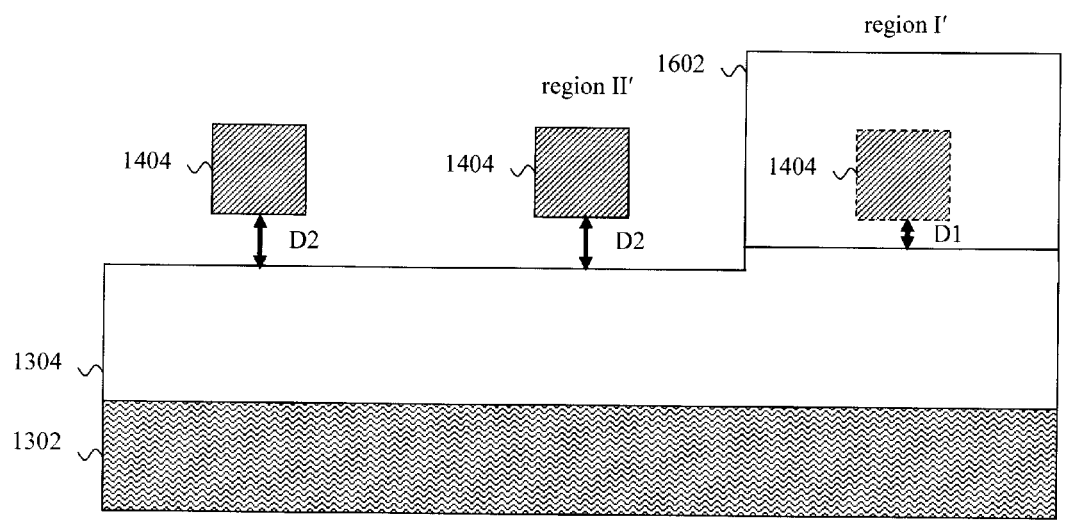
FIG. 16 is a cross-sectional diagram illustrating the BOX having been undercut to a second depth beneath the nanowires in a second region of the wafer according to an embodiment of the present invention.

Moving now to FIG. 16, the depth of the undercut of the BOX 1304 is maintained (at the depth D1) in a first region(s) of the wafer (e.g., in a region I' of the wafer), while the depth of the undercut of the BOX 1304 is increased in one or more other regions of the wafer (e.g., in a region II' of the wafer). According to an exemplary embodiment, a mask 1602 is formed on region I' of the wafer. The mask 1602 will prevent further undercut of the BOX 1304 in region I' of the wafer. According to an exemplary embodiment, mask 1602 is formed from a conventional photoresist or a nitride masking material such as silicon nitride (SiN). A timed etch (e.g., in DHF) is then used to undercut the BOX 1304 to a second depth D2 beneath the nanowires 1404 in a second region(s) (i.e., in region II' of the wafer). As provided above, a BOX etch in DHF can be timed to control the amount of BOX material that is removed.

Figure 17:
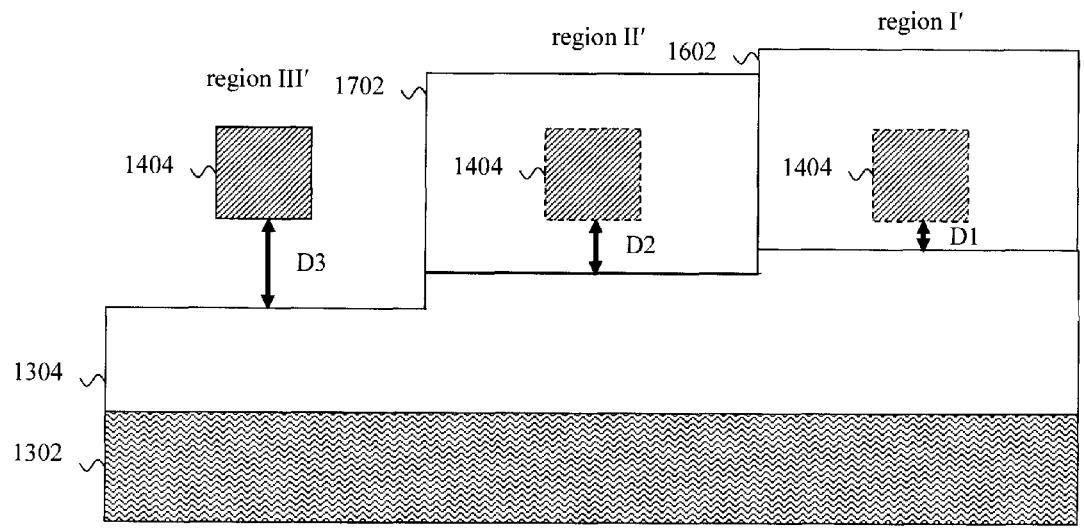
FIG. 17 is a cross-sectional diagram illustrating the BOX having been undercut to a third depth beneath the nanowires in a third region of the wafer according to an embodiment of the present invention.

At this point in the process, the nanowires 1404 are suspended at two different heights over the BOX 1304. One could now move on to process (i.e., reshape) the nanowires and form the gate stacks. However, in order to further illustrate the present process for undercutting the BOX 1304 at various different depths, a third undercut etch is now performed. See FIG. 17. Specifically, as shown in FIG. 17 a mask 1702 is formed on region II' of the wafer. The same masking material may be used as for mask 1602. The mask 1702 will prevent further undercut of the BOX 1304 in region II' of the wafer. In this example it is assumed that the mask 1602 previously formed on region I' of the wafer (see FIG. 16) remains in place. A timed etch (e.g., in DHF) is then used to undercut the BOX 1304 to a third depth D3 beneath the nanowires 1404 in a third region(s) (i.e., in region III') of the wafer. Following the undercut etch the masks 1602 and 1702 can be removed. The nanowires are now suspended over the BOX at three different heights H1', H2', and H3' in regions I', II', and III' of the wafer, respectively. See FIG. 18, described below.

The remainder of the process follows the same basic flow as outlined in the example above. Namely, according to an exemplary embodiment, once suspended by undercutting the BOX 1304, the nanowires 1404 are then re-shaped, e.g., smoothed to give them an elliptical and in some cases a circular cross-sectional shape. See FIG. 18. As provided above, smoothing of the nanowires may be performed, for example, by annealing the nanowires in a hydrogen-containing atmosphere. Exemplary annealing temperatures are from about 600° C. to about 1,000° C., and a hydrogen pressure of from about 600 torr to about 700 torr may be employed. During this smoothing process, the nanowires are also thinned. According to one exemplary embodiment, the nanowires at this stage have a circular cross-sectional shape with a cross-sectional diameter of from about 7 nm to about 35 nm. If so desired, it is also possible to further thin the nanowires using, e.g., a high-temperature oxidation process.

Figure 18:
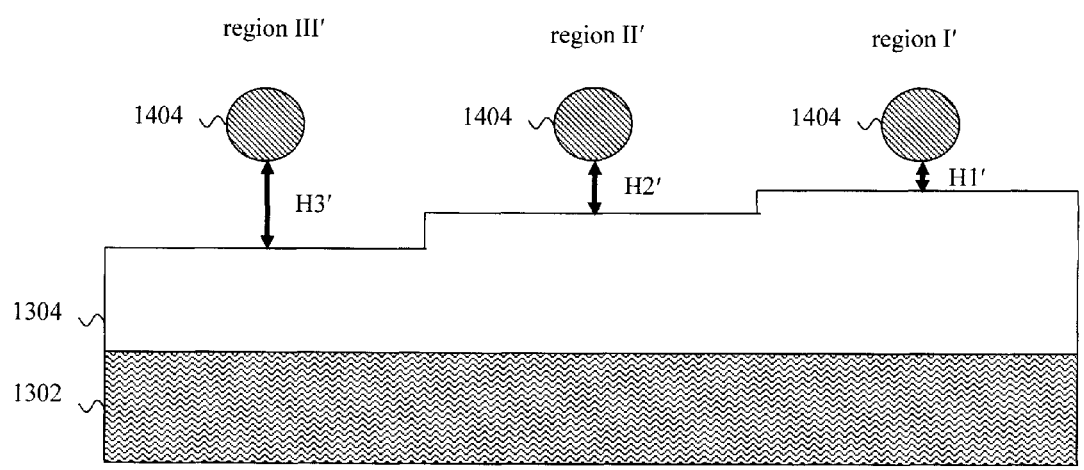
FIG. 18 is a cross-sectional diagram illustrating the nanowires having been re-shaped, e.g., smoothed, to give them a circular cross-sectional shape according to an embodiment of the present invention.
Figure 19:
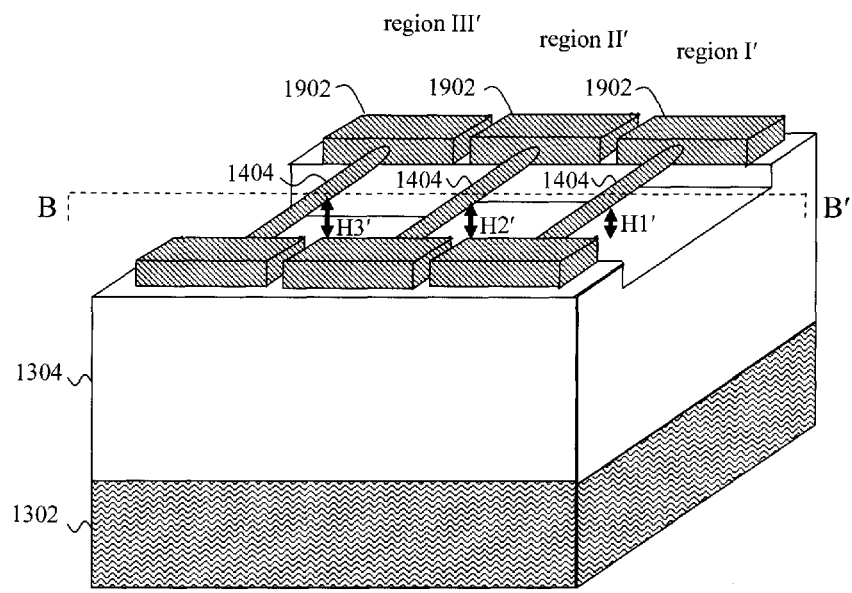
FIG. 19 is a three-dimensional diagram illustrating an exemplary embodiment wherein both nanowires and pads have been patterned in the SOI layer according to an embodiment of the present invention.

As provided above, pads are typically employed to anchor the ends of the nanowires especially when the nanowires are to be suspended. FIG. 19 provides an example of what a three-dimensional representation of the nanowires 1404 and pads 1902 might look like according to an exemplary embodiment wherein both nanowires and pads are patterned in the SOI layer 1306. By way of example only, FIG. 18 depicts a cross-sectional cut through line B-B' (see FIG. 19), and the other cross-sectional views of this exemplary embodiment are similarly oriented in the figures.

In the example shown in FIG. 19, three sets of nanowires 1404 and pads 1902 are formed, one in each of region I', region II', and region III' of the wafer. As provided above, based on the undercuts of the BOX 1304 at different depth, the nanowires 1404 will be suspended at different heights above the BOX 1304 in each of these regions. It is notable that the designation of a particular region of the wafer having nanowires at a particular suspension height (e.g., region III' of the wafer having nanowires at the highest suspension height H3') is arbitrary and the highest, lowest, etc. suspension heights of the nanowires may instead occur in other regions of the wafer. As also provided above, the depiction of a single nanowire in each region is merely exemplary, and embodiments are anticipated herein where multiple suspended nanowires are present in each of one or more of the regions.

In order to anchor the suspended nanowires 1404 to the wafer, the pads 1902 must themselves be attached to the wafer. Thus, as shown in FIG. 19, the BOX 1304 is not fully undercut beneath the pads 1902. Namely, during the above-described undercut etch of the BOX 1304 some lateral etching of the BOX 1304 may occur beneath the pads. The amount of lateral etching is however minimal.

The process now continues with formation of the gate stacks surrounding the nanowires 1404. As described above, the amount by which one or more of the gate stack materials surrounds the nanowires is directly related to the suspension height of the nanowires. Namely, the greater the suspension height, the more space there is beneath the nanowires for the gate stack materials. The amount (i.e., thickness) of each of the gate stack materials also factors into the spacing beneath the nanowires.

Figure 20:
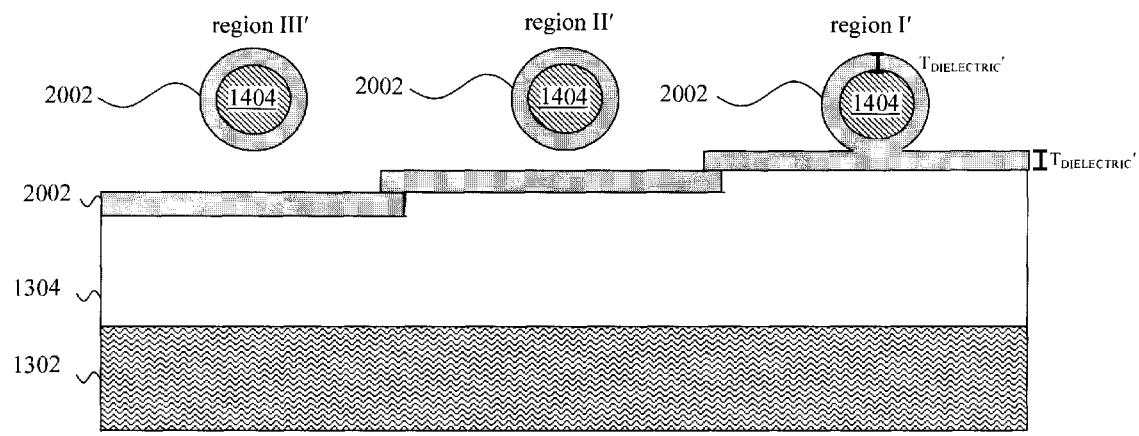
FIG. 20 is a cross-sectional diagram illustrating a conformal gate dielectric having been blanket deposited on the wafer and surrounding the nanowires, wherein a suspension height of the nanowires based on the depth of the undercut BOX determines whether the conformal gate dielectric (of a given thickness) does or does not physically contact the underlying BOX according to an embodiment of the present invention.

Switching back now to a cross-sectional view, as shown in FIG. 20 the gate stack formation process begins with the blanket deposition of a conformal gate dielectric 2002 on the wafer and surrounding the nanowires 1404. Specifically, using a conformal deposition process, such as ALD or CVD, the conformal gate dielectric 2002 is deposited to a uniform thickness $T_{DIELECTRIC}'$ on the exposed surface of the wafer (e.g., on a side of the BOX 1304 opposite the substrate 1302) and around the nanowires 1404. According to an exemplary embodiment, the conformal gate dielectric 2002 is a high-κ dielectric material, such as $HfO_2$ or $LaO_2$. Further, according to an exemplary embodiment, the same gate dielectric material is deposited around each of the nanowires 1404. In that case, a single deposition step may be employed to deposit the conformal gate dielectric 2002 on the BOX 1304 and around the nanowires 1404. However, as provided above, it is also possible to vary the composition of the conformal gate dielectric 2002 from one nanowire or set of nanowires to another.

As shown in FIG. 20, based on the variation in the depth of the undercut BOX resulting in the nanowires 1404 having different suspension heights over the BOX 1304, the space beneath the nanowires can accommodate different amounts of gate stack material. For instance, in the second and third regions of the wafer (i.e., region II' and region III' of the wafer in FIG. 20), the nanowires 1404 are suspended high enough above the surface of the (undercut) BOX 1304 such that when the layer of the conformal gate dielectric 2002 is deposited onto the surface of the BOX 1304 and around the nanowires 1404 to the thickness $T_{DIELECTRIC}'$ there will still be space beneath the nanowires into which additional gate stack materials can be deposited. Namely, following deposition of the conformal gate dielectric 2002 to the thickness $T_{DIELECTRIC}'$, the conformal gate dielectric 2002 deposited onto the surface of the BOX 1304 does not make contact with (i.e., is in a non-contact position with) the conformal gate dielectric 2002 deposited around the nanowires 1404 in region II' and region III' of the wafer. Namely, space is present between the conformal gate dielectric 2002 deposited onto the surface of the BOX 1304 and the conformal gate dielectric 2002 deposited around the nanowires 1404 in region II' and region III' of the wafer.

By contrast, as shown in FIG. 20 following deposition of the conformal gate dielectric 2002 to the thickness $T_{DIELECTRIC}'$, the conformal gate dielectric 2002 deposited onto the surface of the BOX 1304 makes contact with the conformal gate dielectric 2002 deposited around the nanowires 1404 in region I' of the wafer. In the same manner as described above, oxide growth will be used herein to modulate the Vt of the transistors in the present nanowire CMOS device. When there is direct contact between the high-κ gate dielectric and the BOX, such as in region I' of the present example, a greater amount of oxide growth will occur at the interface between the conformal gate dielectric 2002 and the nanowire(s) 1404. The BOX acts as an additional source of oxygen which diffuses through the high-κ gate dielectric. By contrast, in regions II' and III' additional gate stack materials will be deposited between the conformal gate dielectric 2002 on the BOX 1304 and the conformal gate dielectric 2002 on the nanowires 1404. This is due to the nanowires 1404 being more highly suspended over the BOX 1304 in region II' and region III' of the wafer thus providing more space beneath the nanowires 1404 to be filled in with gate stack materials. These gate stack materials deposited under the nanowires 1404 in region II' and region III' of the wafer will separate the conformal gate dielectric 2002 (surrounding the nanowires 1404) from the BOX 1304. In that case, the BOX 1304 will not serve as an additional source of oxygen during growth, and the oxide grown around the nanowires 1404 in region II' and region III' of the wafer will be less than that in region I' of the wafer (where the BOX acts an additional source of oxygen). Namely, as provided above, oxygen source species ($O_2$, O+, or $H_2O$) diffuse much faster and readily in dielectrics such as silicon dioxide ($SiO_2$) and $HfO_2$ than in the other gate stack materials (such as the gate metal, polysilicon, etc.). Thus, when all that separates the nanowires from the BOX is a dielectric such as $HfO_2$, then the BOX can serve as an oxygen source where oxygen species from the BOX can diffuse through the dielectric to the nanowires. Conversely, when gate metal, polysilicon, etc. are present between the nanowires and the BOX through which oxygen species cannot readily diffuse, then the additional oxygen source is not available.

In addition to suspension height, another important factor affecting whether or not the conformal gate dielectric 2002 contacts the BOX 1304 is the thickness of the conformal gate dielectric 2002 $T_{DIELECTRIC}'$. Basically, a thicker $T_{DIELECTRIC}'$ increases the height by which the nanowires 1404 have to be suspended over the BOX 1304 to prevent contact between the conformal gate dielectric 2002 and the BOX 1304, and vice versa. According to an exemplary embodiment, the conformal gate dielectric 2002 is deposited to a uniform thickness $T_{DIELECTRIC}'$ of from about 1 nm to about 5 nm, and ranges therebetween, on the BOX 1304 and surrounding the nanowires 1404.

Next, a conformal gate metal layer 2102 is blanket deposited on the conformal gate dielectric 2002 both on the wafer and around the nanowires 1404. See FIG. 21. Specifically, using a conformal deposition process, such as ALD or CVD, the conformal gate metal layer 2102 is deposited to a uniform thickness $T_{METAL}'$ on the wafer (i.e., on a side of the conformal gate dielectric 2002 opposite the BOX 1304) and around the nanowires 1404 (i.e., on a side of the conformal gate dielectric 2002 opposite the nanowires 1404). According to an exemplary embodiment, the conformal gate metal layer 2102 includes titanium and/or tantalum, e.g., titanium nitride and/or tantalum nitride. Further, according to an exemplary embodiment, the same gate metal is deposited around each of the nanowires 1404. In that case, a single deposition step may be employed to deposit the conformal gate metal layer 2102 on the conformal gate dielectric 2002 over the BOX and around the nanowires. However, as provided above, it is also possible to vary the composition of the conformal gate metal layer 2102 from one nanowire or set of nanowires to another.

Figure 21:
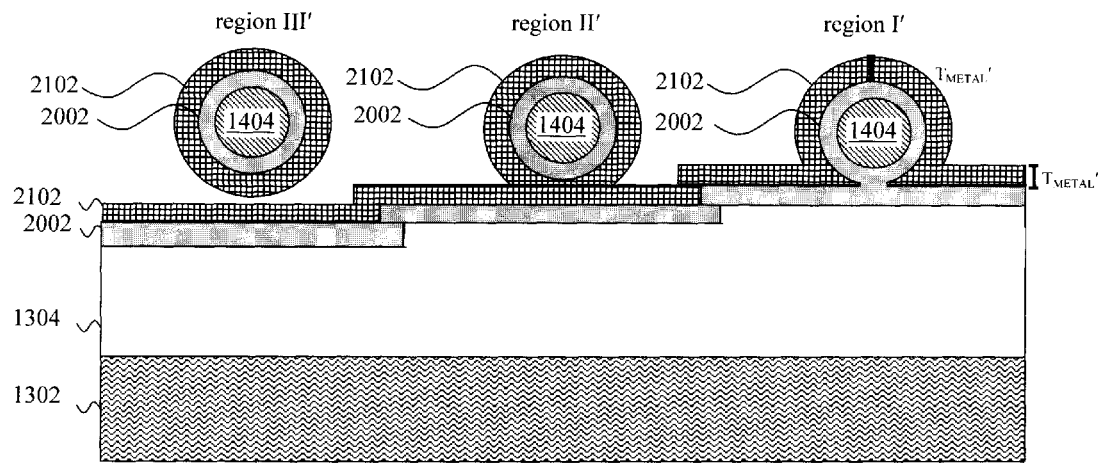
FIG. 21 is a cross-sectional diagram illustrating a conformal gate metal layer having been blanket deposited on the conformal gate dielectric both on the wafer and around the nanowires according to an embodiment of the present invention.

As shown in FIG. 21, based on the nanowires 1404 having different suspension heights over the (undercut) BOX 1304, in the second and third regions of the wafer (i.e., region II' and region III' of the wafer) the conformal gate metal layer 2102 (of thickness $T_{METAL}'$) fully surrounds the nanowires 1404 and thereby physically separates the conformal gate dielectric 2002 surrounding the nanowires 1404 from the underlying BOX 1304. Thus in region II' and region III' of the wafer the conformal gate dielectric 2002 is not in contact with the BOX 1304. By contrast, in region I' of the wafer the conformal gate dielectric 2002 surrounding the nanowire(s) 1404 is contact with the conformal gate dielectric 2002 on the BOX 1304. Thus, in region I' of the wafer there is direct physical contact between the conformal gate dielectric 2002 and the BOX 1304. The space beneath the nanowire(s) in this first region (region I') of the wafer is closed off by the conformal gate dielectric 2002 over the BOX and around the nanowires and thus does not permit the placement of any additional gate stack materials beneath the nanowire(s) in this region. Accordingly, the conformal gate metal layer 2102 in the region I' of the wafer does not completely surround the nanowire(s) (i.e., the conformal gate metal layer 2102 in the region I' of the wafer only partially surrounds the nanowire(s)). According to an exemplary embodiment, conformal gate metal layer 2102 is deposited to a uniform thickness $T_{METAL}'$ of from about 5 nm to about 20 nm, and ranges therebetween, on the conformal gate dielectric 2002 over the BOX and around the nanowires.

A conformal polysilicon layer 2202 is then blanket deposited on the conformal gate metal layer 2102 both on the wafer and around the nanowires 1404. See FIG. 22. Specifically, using a conformal deposition process, such as ALD or CVD, the conformal polysilicon layer 2202 is deposited to a uniform thickness $T_{POLY-Si}'$ on the wafer (i.e., on a side of the conformal gate metal layer 2102 opposite the conformal gate dielectric 2002) and around the nanowires 1404 (i.e., on a side of the conformal gate metal layer 2102 opposite the conformal gate dielectric 2002).

Figure 22:
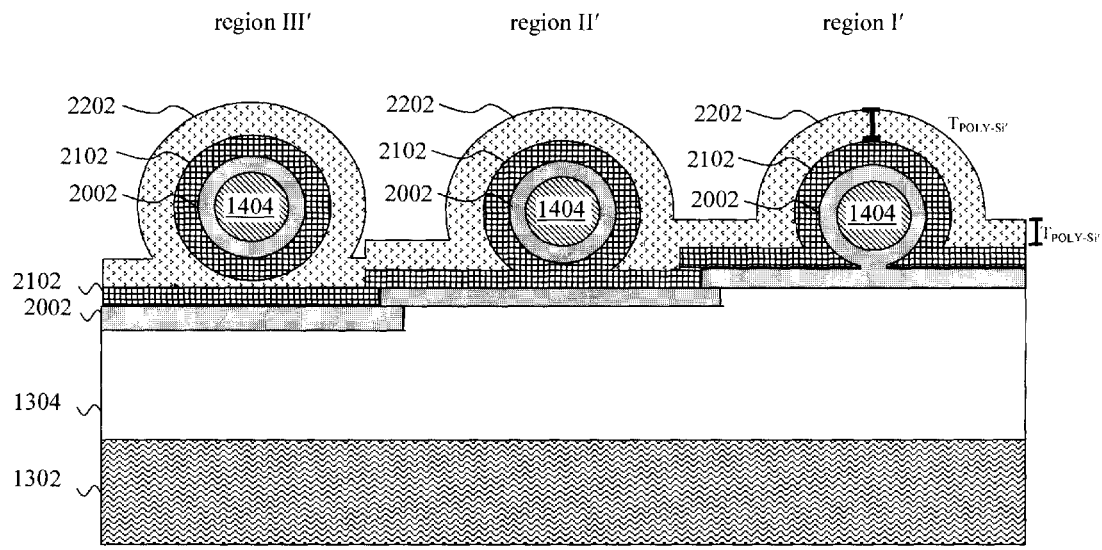
FIG. 22 is a cross-sectional diagram illustrating a conformal polysilicon layer having been blanket deposited on the conformal gate metal layer both on the wafer and around the nanowires according to an embodiment of the present invention.

As shown in FIG. 22, based on the nanowires 1404 having different suspension heights over the (undercut) BOX 1304, in the third region of the wafer (i.e., region III' of the wafer) the conformal polysilicon layer 2202 (of thickness $T_{POLY-Si}'$) fully surrounds the nanowire(s) 1404 and (along with the conformal gate metal layer 2102) thereby physically separates the conformal gate dielectric 2002 surrounding the nanowire(s) 1404 from the underlying BOX 1304. In region II' of the wafer, the conformal gate metal layer 2102 alone physically separates the conformal gate dielectric 2002 surrounding the nanowire(s) 1404 from the underlying BOX 1304—i.e., the conformal polysilicon layer 2202 in the region II' of the wafer only partially surrounds the nanowire(s). Thus in region II' and region III' of the wafer the conformal gate dielectric 2002 is not in contact with the BOX 1304. By contrast, as provided above, in region I' of the wafer there is direct physical contact between the conformal gate dielectric 2002 and the BOX 1304. According to an exemplary embodiment, conformal polysilicon layer 2202 is deposited to a uniform thickness $T_{POLY-Si}'$ of from about 10 nm to about 30 nm, and ranges therebetween, on the conformal gate metal layer 2102 over the BOX and around the nanowires.

Figure 23:
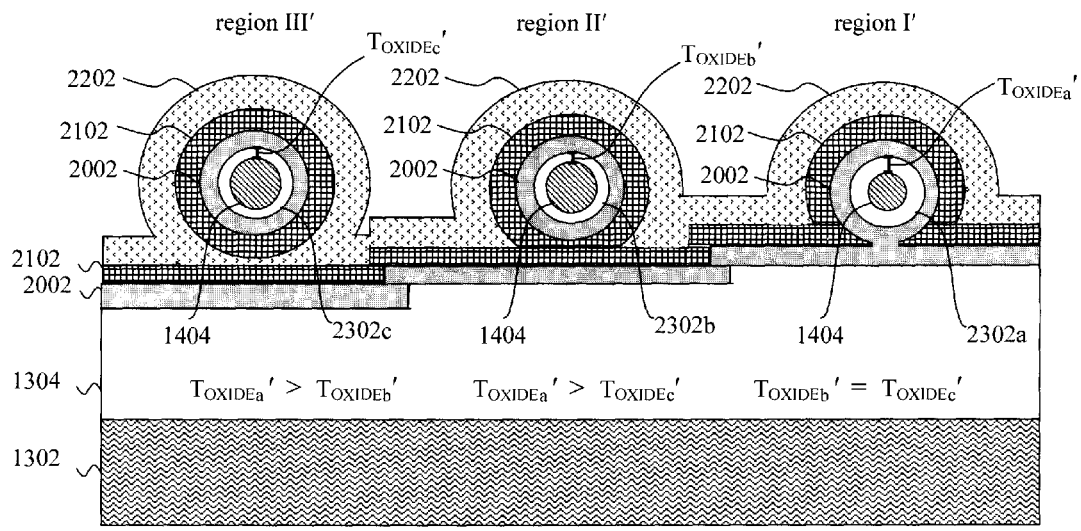
FIG. 23 is a cross-sectional diagram illustrating an anneal in an oxygen ambient having been used to form a conformal oxide layer at the interface between the conformal gate dielectric and the nanowires wherein the conformal gate dielectric, when in direct physical contact with the BOX, permits the BOX to act as an additional oxygen source according to an embodiment of the present invention.

As shown in FIG. 23, an anneal in an oxygen ambient is then used to form a conformal oxide layer 2302 at the interface between the conformal gate dielectric 2002 and the nanowires 1404. Oxidation occurs at the interface between the conformal gate dielectric and the nanowires due to the relative oxygen affinity of the gate dielectric (e.g., $HfO_2$) versus the semiconductor material in the nanowires (Si, for example, steals oxygen from $HfO_2$ and makes it slightly sub stoichiometric) and metal catalyzation of the oxide growth. Thus, the conformal oxide layer formed is an oxide of the semiconductor material in the nanowires, e.g., $SiO_2$ for Si wires, $GeO_2$ for Ge nanowires, or silicon germanium oxide for SiGe nanowires. As above, the anneal may be performed at a temperature of from about 200° C. to about 500° C., and ranges therebetween, for a duration of from about 5 minutes to about 15 minutes, and ranges therebetween. In the case where the conformal gate dielectric 2002 is in direct physical contact with the BOX 1304 (in region I' of the wafer in this example), the BOX acts as an additional source of oxygen (i.e., in addition to that provided in the oxygen ambient) which diffuses through the conformal gate dielectric 2002—resulting in a greater amount of oxide growth at the interface between the conformal gate dielectric 2002 and the nanowires 1404. By comparison, in the case where the conformal gate dielectric 2002 is not in direct physical contact with the BOX 1304 (in region II' and region III' of the wafer in this example), there is no other source of oxygen than what is provided in the ambient—resulting in a lesser amount of oxide growth at the interface between the conformal gate dielectric 2002 and the nanowires 1404. As provided above, the greater the amount of oxide growth the lower the Vt.

The conformal oxide layer formed at the interface between the conformal gate dielectric 2002 and the nanowires 1404 in each of region I', region II', and region III' of the wafer is given the reference numeral 2302a, 2302b, and 2302c, respectively. The amount of oxide growth is quantified herein based on a thickness of the conformal oxide layer $T_{OXIDE}'$. The thickness of the conformal oxide layers 2302a, 2302b, and 2302c, are labeled in FIG. 23 as $T_{OXIDEa}'$, $T_{OXIDEb}'$, and $T_{OXIDEc}'$, respectively. As shown in FIG. 23, the thickness of the conformal oxide layer 2302a formed at the interface between the conformal gate dielectric 2002 and the nanowires 1404 in region I' of the wafer ($T_{OXIDEa}'$) is greater than the thickness of either the thickness of the conformal oxide layer 2302b formed at the interface between the conformal gate dielectric 2002 and the nanowires 1404 in region II' of the wafer ($T_{OXIDEb}'$) or the thickness of the conformal oxide layer 2302c formed at the interface between the conformal gate dielectric 2002 and the nanowires 1404 in region III' of the wafer ($T_{OXIDEc}'$). Since, there is no direct physical contact between the conformal gate dielectric 2002 and the BOX 1304 in region II' and region III' of the wafer, $T_{OXIDEb}'$ and $T_{OXIDEc}'$ are likely the same (i.e., $T_{OXIDEb}'=T_{OXIDEc}'$). See FIG. 23. According to an exemplary embodiment, $T_{OXIDEb}'$ and $T_{OXIDEc}'$ are each from about 0.1 nm to about 1 nm, and ranges therebetween; and $T_{OXIDEa}'$ is from about 0.5 nm to about 2 nm, and ranges therebetween.

Figure 24:
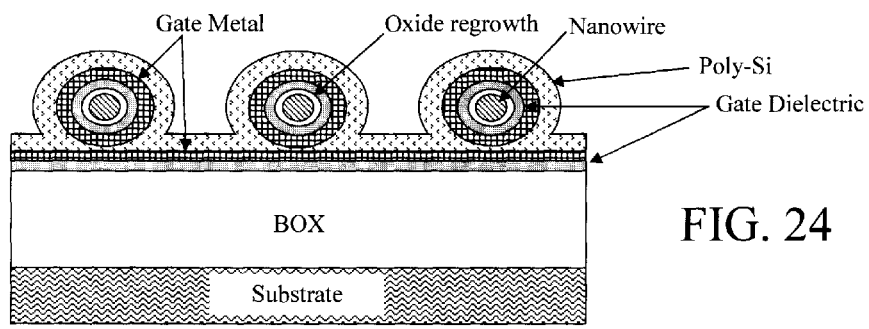
FIG. 24 is a cross-sectional diagram illustrating the present device having multiple nanowires at a given suspension height over the BOX such that the gate dielectric is not in direct physical contact with the BOX and therefore minimal oxide growth occurs at the interface between the conformal gate dielectric and the nanowires according to an embodiment of the present invention.

As provided above, the depiction of a single nanowire in each region of the wafer in the above examples is merely exemplary. Embodiments are anticipated herein where each transistor device contains multiple nanowires at a given suspension height. By way of example only, FIG. 24 illustrates one of the present transistor devices having multiple nanowires with a suspension height over the BOX so as to permit the inclusion of gate stack materials between the nanowires and the BOX, thus preventing the gate dielectric from being in contact with the BOX. Accordingly, as shown in FIG. 24, during oxide growth only a minimal amount of oxide is formed at the interface between the gate dielectric and the nanowires. The nanowires depicted in FIG. 24 are representative of the nanowires having the highest suspension height over the BOX, such as those in region I of the preceding stepped SOI layer example, or those in region III' in the preceding BOX undercut example.

Figure 25:
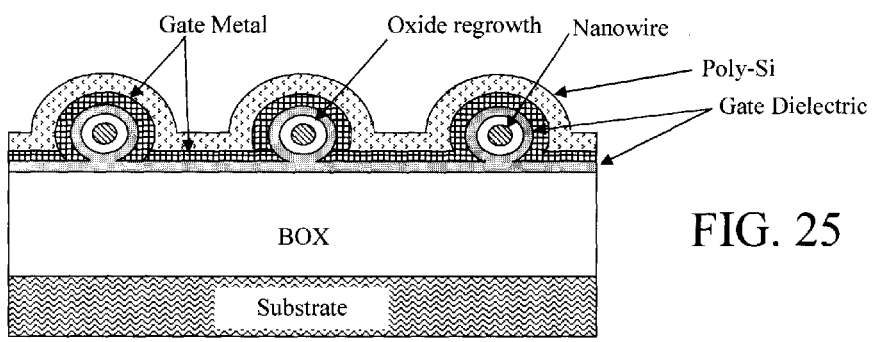
FIG. 25 is a cross-sectional diagram illustrating the present device having multiple nanowires at a given suspension height over the BOX such that the gate dielectric is in direct physical contact with the BOX and therefore an increased amount of oxide growth occurs at the interface between the conformal gate dielectric and the nanowires according to an embodiment of the present invention.

By contrast, FIG. 25 illustrates one of the present transistor devices having multiple nanowires with a suspension height over the BOX that excludes all but the gate dielectric from being present between the nanowires and the BOX. In this case, the gate dielectric is in direct physical contact with the BOX and can act as an additional oxygen source. Accordingly, as shown in FIG. 25, during oxide growth a greater amount of oxide is formed at the interface between the gate dielectric and the nanowires. Compare FIG. 24 and FIG. 25. The nanowires depicted in FIG. 25 are representative of the nanowires having the lowest suspension height over the BOX, such as those in region III of the preceding stepped SOI layer example or those in region I' in the preceding BOX undercut example.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a complementary metal oxide semiconductor (CMOS) device, the method comprising the steps of:
    providing a semiconductor-on-insulator (SOI) wafer having a SOI layer separated from a substrate by a buried oxide (BOX);
    forming nanowires suspended over the BOX, wherein a first one or more of the nanowires are suspended at a first suspension height over the BOX and a second one or more of the nanowires are suspended at a second suspension height over the BOX, and wherein the first suspension height is greater than the second suspension height;
    depositing a conformal gate dielectric on the BOX and around the nanowires, wherein the conformal gate dielectric deposited on the BOX is i) in a non-contact position with the conformal gate dielectric deposited around the first one or more of the nanowires, and ii) is in direct physical contact with the conformal gate dielectric deposited around the second one or more of the nanowires;
    depositing a conformal gate metal layer on the conformal gate dielectric both on the wafer and on the nanowires, wherein the conformal gate metal layer fully surrounds the first one or more of the nanowires but only partially surrounds the second one or more of the nanowires due to the conformal gate dielectric on the BOX being in direct physical contact with the conformal gate dielectric around the second one or more of the nanowires;
    depositing a conformal polysilicon layer on the conformal gate metal layer both on the wafer and on the nanowires; and
    annealing the CMOS device in an oxygen ambient to grow a conformal oxide layer at an interface between the conformal gate dielectric and the nanowires, wherein the conformal oxide layer grown at the interface between the conformal gate dielectric and the first one or more of the nanowires has a first thickness and the conformal oxide layer grown at the interface between the conformal gate dielectric and the second one or more of the nanowires has a second thickness, and wherein the first thickness is less than the second thickness due to the BOX serving as an oxygen source during growth of the conformal oxide layer at the interface between the conformal gate dielectric and the second one or more of the nanowires.

2. The method of claim 1, wherein the conformal gate dielectric is deposited on the BOX and around the nanowires to a uniform thickness of from about 1 nm to about 5 nm, and ranges therebetween.

3. The method of claim 1, wherein the conformal gate metal layer is deposited on the conformal gate dielectric to a uniform thickness of from about 5 nm to about 20 nm, and ranges therebetween.

4. The method of claim 1, wherein the conformal polysilicon layer is deposited on the conformal gate metal layer to a uniform thickness of from about 10 nm to about 30 nm, and ranges therebetween.

5. The method of claim 1, wherein the conformal polysilicon layer fully surrounds the first one or more of the nanowires.

6. The method of claim 1, wherein the conformal polysilicon layer only partially surrounds the second one or more of the nanowires.

7. The method of claim 1, further comprising the steps of:
    creating a stepped surface on a side of the SOI layer opposite the BOX;
    growing an epitaxial semiconductor layer on the stepped surface;
    patterning fins in the epitaxial semiconductor layer and the SOI layer; and
    removing the SOI layer from the fins selective to the epitaxial semiconductor layer such that the epitaxial semiconductor layer forms the nanowires suspended over the BOX, wherein the first one or more of the nanowires are suspended at a first suspension height over the BOX and a second one or more of the nanowires are suspended at a second suspension height over the BOX based on the nanowires having been formed on the stepped surface.

8. The method of claim 7, wherein the SOI layer comprises silicon germanium.

9. The method of claim 7, wherein the epitaxial semiconductor layer comprises silicon.

10. The method of claim 7, further comprising the step of:
    reshaping the nanowires to give the nanowires a circular cross-sectional shape.

11. The method of claim 7, wherein the step of creating a stepped surface on a side of the SOI layer opposite the BOX comprises the steps of:
    masking the SOI layer in a first region of the wafer; and
    etching the SOI layer to reduce a thickness of the SOI layer in one or more second regions of the wafer.

12. The method of claim 7, wherein the epitaxial semiconductor layer is grown on the stepped surface to a uniform thickness of from about 5 nm to about 20 nm, and ranges therebetween.

13. The method of claim 1, further comprising the steps of:
    patterning the nanowires in the SOI layer; and
    undercutting the BOX beneath the nanowires to suspend the nanowires over the BOX, wherein the BOX is undercut to a first depth beneath the first one or more of the nanowires and the BOX is undercut to a second depth beneath the second one or more of the nanowires, and wherein the first depth is greater than the second depth.

14. The method of claim 13, wherein the SOI layer comprises silicon, germanium, or silicon germanium.

15. The method of claim 13, wherein the step of undercutting the BOX beneath the nanowires comprises the steps of:
    undercutting the BOX to the first depth beneath the nanowires in a first region of the wafer;
    masking the first region of the wafer; and
    undercutting the BOX to the second depth beneath the nanowires in a second region of the wafer.

16. A CMOS device, comprising:
    nanowires suspended over a BOX, wherein a first one or more of the nanowires are suspended at a first suspension height over the BOX and a second one or more of the nanowires are suspended at a second suspension height over the BOX, and wherein the first suspension height is greater than the second suspension height;

a conformal gate dielectric on the BOX and around the nanowires, wherein the conformal gate dielectric on the BOX is i) in a non-contact position with the conformal gate dielectric around the first one or more of the nanowires, and ii) is in direct physical contact with the conformal gate dielectric around the second one or more of the nanowires;

a conformal gate metal layer on the conformal gate dielectric both on the wafer and on the nanowires, wherein the conformal gate metal layer fully surrounds the first one or more of the nanowires but only partially surrounds the second one or more of the nanowires due to the conformal gate dielectric on the BOX being in direct physical contact with the conformal gate dielectric around the second one or more of the nanowires;

a conformal polysilicon layer on the conformal gate metal layer both on the wafer and on the nanowires; and a conformal oxide layer at an interface between the conformal gate dielectric and the nanowires, wherein the conformal oxide layer at the interface between the conformal gate dielectric and the first one or more of the nanowires has a first thickness and the conformal oxide layer at the interface between the conformal gate dielectric and the second one or more of the nanowires has a second thickness, and wherein the first thickness is less than the second thickness.

17. The CMOS device of claim 16, wherein the conformal gate dielectric on the BOX and around the nanowires has a uniform thickness of from about 1 nm to about 5 nm, and ranges therebetween.

18. The CMOS device of claim 16, wherein the conformal gate metal layer on the conformal gate dielectric has a uniform thickness of from about 5 nm to about 20 nm, and ranges therebetween.

19. The CMOS device of claim 16, wherein the conformal polysilicon layer on the conformal gate metal layer has a uniform thickness of from about 10 nm to about 30 nm, and ranges therebetween.

20. The CMOS device of claim 16, wherein the BOX is undercut beneath the nanowires such that the BOX is undercut to a first depth beneath the first one or more of the nanowires and the BOX is undercut to a second depth beneath the second one or more of the nanowires, and wherein the first depth is greater than the second depth.

* * * * *